United States Patent
Sasaki et al.

(10) Patent No.: US 6,555,289 B2
(45) Date of Patent: Apr. 29, 2003

(54) POSITIVE PHOTORESIST COMPOSITION

(75) Inventors: Tomoya Sasaki, Shizuoka (JP); Kazuyoshi Mizutani, Shizuoka (JP); Shoichiro Yasunami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 51 days.

(21) Appl. No.: 09/826,850

(22) Filed: Apr. 6, 2001

(65) Prior Publication Data

US 2002/0048720 A1 Apr. 25, 2002

(30) Foreign Application Priority Data

Apr. 6, 2000 (JP) .......................................... 2000-105299

(51) Int. Cl.$^7$ ............................. G03C 1/73; G03F 7/039
(52) U.S. Cl. .................. 430/270.1; 430/326; 430/905; 430/906; 430/907; 430/910; 430/914; 526/258; 526/262; 526/271; 526/279; 526/270
(58) Field of Search ............................. 430/270.1, 326, 430/905, 906, 910, 907, 914; 526/279, 258, 271, 270, 262

(56) References Cited

U.S. PATENT DOCUMENTS

| 5,759,736 | A | * | 6/1998 | Nishi et al. .................. 430/190 |
| 6,110,637 | A | | 8/2000 | Sezi et al. ............... 430/270.1 |
| 6,159,653 | A | * | 12/2000 | Malik et al. ............. 430/270.1 |
| 6,165,682 | A | * | 12/2000 | Foster et al. ............. 430/270.1 |
| 6,306,990 | B1 | * | 10/2001 | Hien et al. .................. 526/272 |

FOREIGN PATENT DOCUMENTS

JP A-11-231542 8/1999

* cited by examiner

*Primary Examiner*—Janet Baxter
*Assistant Examiner*—Sin J. Lee
(74) *Attorney, Agent, or Firm*—Sughrue Mion, PLLC

(57) ABSTRACT

Provided is a positive photoresist composition for use in the production of a semiconductor device, which ensures high resolution, reduced edge roughness of a line pattern and a small number of development defects. The positive photoresist composition comprises a resin having a specific silicon-containing group on the side chain, the solubility of which resin in an alkali developer increases under the action of an acid.

7 Claims, No Drawings

POSITIVE PHOTORESIST COMPOSITION

FIELD OF THE INVENTION

The present invention relates to a positive photoresist composition for use in the production of a semiconductor integrated circuit device, a mask for the production of an integrated circuit, a printed board, a liquid crystal panel and the like.

BACKGROUND OF THE INVENTION

In the formation of a pattern for the production of electronic parts of semiconductor device, magnetic bubble memory, integrated circuit and the like, a method of using a photoresist sensitive to ultraviolet ray or visible light has heretofore been widely used in practice. The photoresist includes a negative type photoresist where the area irradiated with light is insolubilized in the developer and a positive type photoresist where the area is solubilized. The negative type photoresist is predominating until recent years because the sensitivity is high as compared with the positive type and the properties necessary for the wet etching are excellent, namely, adhesive property to the substrate and resistance against chemicals.

However, with the progress of high-densification and high-integration semiconductor devices and the like, the pattern is extremely reduced in the line width or space. Furthermore, dry etching is employed for the etching of the substrate and to keep up with this, the photoresist is demanded to have high resolution and high dry etching resistance. Because of these reasons, the positive photoresist occupies the major part at present.

Furthermore, in recent years, with the progress of multi-function and high-performance electronic equipment, a finer pattern is strongly demanded so as to attain higher densification and higher integration.

More specifically, the integrated circuit is not so much reduced in the vertical dimension as compared with the reduction in the transverse direction and therefore, the ratio of the height to the width of the resist pattern must be necessarily large. Due to this, as the pattern becomes finer, the resist pattern on a wafer having a complicated structure with different heights encounters more difficulties in suppressing its dimensional change.

Furthermore, in various exposure systems, a problem arises accompanying the reduction of the minimum dimension. For example, in the exposure by light, the interference action of the reflected light ascribable to the difference in height on a substrate greatly affects the dimensional precision and in the electronic beam exposure, the ratio of the height to the width of a fine resist pattern cannot be increased due to the proximity effect generated by the back scattering of electrons.

It has been found that a large number of these problems can be solved by using a multi-layer resist system. The multi-layer resist system is generally described in *Solid State Technology*, 74 (1981) and other than this, many publications report the studies on this system.

In general, the multi-layer resist system includes a three-layer resist system and a two-layer resist system. The three-layer resist system is a method of coating an organic flattening film on a substrate having different heights, superposing thereon an inorganic intermediate layer and a resist, patterning the resist, dry-etching the inorganic intermediate layer using the resist as the mask, and patterning the organic flattening film by $O_2RIE$ (reactive ion etching) using the inorganic intermediate layer as the mask. In this system, conventional techniques can be fundamentally used, therefore, studies thereon have been started from an early time. However, this system has a problem in that the process is very complicated or since three layers different in the physical properties, namely, organic film, inorganic film and organic film, are superposed, cracks or pinholes are readily generated in the intermediate layer.

As compared with this three-layer resist system, the two-layer resist system uses a resist having properties both of the resist and the inorganic intermediate layer of the three-layer resist system, namely, a resist having resistance against oxygen plasma, and therefore, cracks or pinholes are prevented from occurring. Furthermore, the reduction from three layers to two layers simplifies the process. However, unlike the three-layer resist system where a conventional resist can be used as the upper layer resist, the two-layer resist system must disadvantageously develop a new resist having resistance against oxygen plasma.

Under these circumstances, it has been demanded to develop a high-sensitivity and high-resolution positive photoresist having excellent oxygen plasma resistance and capable of use as the upper layer resist in the two-layer resist system or the like, particularly an alkali development-system resist for which the current process can be used without any change.

In the production of VLSI comprising lines having a width of half micron or less, the wavelength used in the exposure apparatus for lithography becomes shorter and shorter and at the present time, studies are being made even on the use of KrF excimer laser ray or ArF excimer laser ray. In the photolithography using such a short wavelength, a resist called chemical amplification-type resist is generally used.

Particularly, in the case of using ArF excimer laser ray, it is not suitable in view of the optical transparency of the film to introduce a phenol structure into the binder resin as a main component of the resist. The binder generally used is a resin polymer containing, as an image-forming site, a structure capable of decomposing by an acid and generating a carboxylic acid, such as tertiary ester (e.g., tert-butyl ester), 1-alkyladamantyl ester and THP protected entity of carboxylic acid.

As an example of the Si-containing resist having an image-forming site transparent to ArF excimer laser rays, a polymer comprising maleic acid anhydride-unsaturated tert-butyl carboxylate-allyltrimethylsilane-ethoxyethyl methacrylate is disclosed in JP-A-11-231542 (the term "JP-A" as used herein means an "unexamined published Japanese patent application"). This resist has a problem in that the resolution in the processing of an ultrafine pattern and the edge roughness of a line pattern are bad. The term "edge roughness" as used herein means a phenomenon that due to the properties of the resist, the edges at the top and bottom of a resist line pattern irregularly fluctuate in the direction perpendicular to the line direction and irregularities are observed on the edges when the pattern is viewed from right above. Furthermore, the coated film has high hydrophobicity and therefore, the exposed area shows poor permeability to an alkali developer, as a result, a large number of development defects are disadvantageously generated.

SUMMARY OF THE INVENTION

The object of the present invention is to provide a positive photoresist composition for use in the production of semiconductor devices, which ensures high resolution, excellent edge roughness of a line pattern, and reduced development defects.

As a result of extensive investigations on the resist composition in the positive chemical amplification system, the present inventors have found that by using an acid-decomposable resin obtained by copolymerizing specific repeating units, the object of the present invention can be attained. More specifically, the present invention provides the following positive photoresist composition.

(1) A positive photoresist composition comprising (A) a resin which comprises (a) a repeating unit represented by formula (I) shown below, (b) at least one repeating unit represented by formula (IIa) or (IIb) shown below, (c) a repeating unit represented by formula (III) shown below and (d) a repeating unit (IV) satisfying the following conditions:

to be copolymerizable with monomers corresponding to the repeating units represented by formulae (I) to (III), to contain at least one functional group selected from the group consisting of a group containing a lactone structure, a group containing a lactam structure, —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, wherein R, Ra and Rb each independently represents an alkyl or aryl group having from 1 to 10 carbon atoms, which may be substituted, and to be substantially incapable of decomposing by an acid, and which increases in the solubility in an alkali developer under the action of an acid:

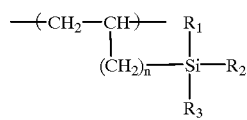
(I)

wherein $R^1$ to $R^3$ each independently represents an alkyl group, a haloalkyl group, a halogen atom, an alkoxy group, a trialkylsilyl group or a trialkylsilyloxy group, and n represents 0 or 1;

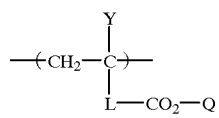
(IIa)

wherein Y represents a group selected from the group consisting of a hydrogen atom, a methyl group, a cyano group and a chlorine atom, L represents a single bond or a divalent linking group, and Q represents a hydrogen atom or a group capable of decomposing by an acid to generate a carboxylic acid;

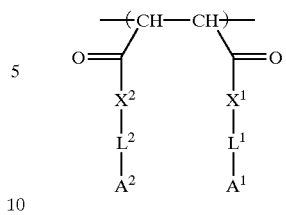
(IIb)

wherein $X^1$ and $X^2$ each independently represents a group selected from an oxygen atom, a sulfur atom, —NH— and —NHSO$_2$—; $L^1$ and $L^2$ each independently represents a single bond or a divalent linking group; $A^1$ represents —Q' or —COOQ', provided that when $X^1$ represents an oxygen atom and $L^1$ represents a single bond, $A^1$ represents —Q'; $A^2$ represents a hydrogen atom, a cyano group, a hydroxyl group, —COOH, —COOR', —CO—NH—R", an alkyl group which may be substituted, a cyclic hydrocarbon group which may be substituted, an alkoxy group or —COOQ', wherein R' and R" each independently represents an alkyl group which may have a substituent; and Q' represents a group capable of decomposing by an acid to generate a carboxylic acid;

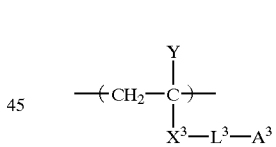
(III)

wherein Z represents an oxygen atom or N—$R^4$, $R^4$ represents a hydrogen atom, a hydroxyl group, an alkyl group having a linear or branched chain, or —O—SO$_2$—$R^5$, and $R^5$ represents an alkyl group or a trihalomethyl group.

(2) The positive photoresist composition as described in (1) above, wherein the repeating unit (IV) is a repeating unit satisfying the conditions required for the repeating unit (IV) and represented by the following formula (IV):

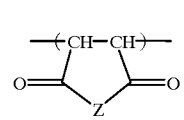
(IV)

wherein Y represents a group selected from the group consisting of a hydrogen atom, a methyl group, a cyano group and a chlorine atom, $X^3$ represents a group selected from the group consisting of —CO$_2$—, —O— and —CON(R)—, wherein R has the same meaning as above, $L^3$ represents a single bond or a divalent linking group, and $A^3$ represents a group represented by the following formula (V) or (VI):

—$X^4$—(Rc)$_{m1}$ (V)

wherein $X^4$ represents an alicyclic hydrocarbon group which may contain a carbonyl bond or an ester bond within the ring, each Rc independently represents a hydrogen atom, an alkyl group, an alkyl group containing as a substituent at least one functional group selected from the group consisting of —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, or a group selected from the group consisting of —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, wherein R, Ra and Rb each has the same meaning as above, and m1 represents an integer of 0 to 5;

(VI)

wherein Rc1 and Rc3 each independently represents a hydrogen atom, an alkyl group having from 1 to 10 carbon atoms, which may be substituted, an alkyl group containing as a substituent at least one functional group selected from the group consisting of —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, or a group selected from the group consisting of —COOH, —COORa, —CONHRa, —CONHSO$_2$Ra, —CON(R)SO$_2$Ra, —CON(Ra)(Rb) and —CN, provided that Rc1 and Rc3 are not simultaneously hydrogen; and Rc2 represents a group selected from the group consisting of —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, wherein R, Ra and Rb each has the same meaning as above.

(3) The positive photoresist composition as described in (2) above, wherein A$^3$ in formula (IV) is a group represented by the following formula (VII):

(VII)

wherein X$^5$ represents a group selected from —CO—O— and —C(=O)—, Rc and m1 each has the same meaning as above, and m$_5$ represents an integer of 0 to 2.

(4) The positive photoresist composition as described in (3) above, wherein the group represented by formula (VII) is a group represented by the following formula (VIII) or (IX):

(VIII)

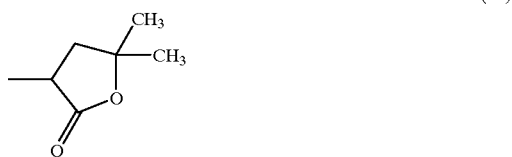
(IX)

(5) The positive photoresist composition as described in (2) above, wherein X$^4$ in formula (V) is an adamantane residue.

(6) The positive photoresist composition as described in any one of (1) to (5) above, which comprises:

(B) a compound capable of generating an acid upon irradiation with actinic rays or radiation, (C) an organic solvent capable of dissolving (A) and (B), and (D) an organic basic compound, in addition to the resin (A).

(7) The positive photoresist composition as described in (6) above, wherein the component (B) is a compound capable of generating an organic sulfonic acid upon irradiation with actinic rays or radiation.

(8) The positive photoresist composition as described in any one of (1) to (7) above, which further comprises (F) at least one of a fluorine-containing surfactant, a silicon-containing surfactant and a nonionic surfactant.

In the present invention, by using a silicon-containing acid-decomposable resin containing repeating units having the above-described specific structures, the resolution and the development defect are improved and by further adding an organic basic compound, the line edge roughness of a pattern is improved. The mechanism of bringing about the improvement of the line edge roughness is not clearly known, however, it is presumed that the high hydrophilic part, the component (B) and the organic basic compound in the resin undertake the work in cooperation and thereby, the decomposition ratio of the acid-decomposable group in the resin is controlled in areas corresponding to the line side wall and the edge part.

DETAILED DESCRIPTION OF THE INVENTION

The resin (A) for use in the present invention is described below.

In the repeating structural unit (I), R$^1$ to R$^3$ each independently represents a group selected from an alkyl group, a haloalkyl group, a halogen atom, an alkoxy group, a trialkylsilyl group and a trialkylsilyloxy group.

The alkyl group is preferably a linear or branched alkyl group having from 1 to 10 carbon atoms, more preferably a linear or branched alkyl group having from 1 to 6 carbon atoms, still more preferably a methyl group, an ethyl group, an n-propyl group, an i-propyl group, an n-butyl group, an i-butyl group, an s-butyl group or a tert-butyl group.

Examples of the haloalkyl group include a chloromethyl group, a bromomethyl group and an iodomethyl group.

The alkoxy group is preferably a linear or branched alkoxyl group having from 1 to 6 carbon atoms, more preferably a methoxy group, an ethoxy group, an n-propyloxy group, an i-propyloxy group, an n-butoxy group, an i-butoxy group, a sec-butoxy group or a tert-butoxy group, still more preferably a methoxy group or an ethoxy group.

The alkyl group of the trialkylsilyl group is preferably a linear or branched alkyl group having from 1 to 6 carbon atoms, more preferably a methyl group, an ethyl group, an n-propyl group, an i-propyl group, an n-butyl group, an i-butyl group, a sec-butyl group or a tert-butyl group, most preferably a methyl group.

The alkyl group of the trialkylsilyloxy group is preferably a linear or branched alkyl group having from 1 to 6 carbon atoms, more preferably a methyl group, an ethyl group, an n-propyl group, an i-propyl group, an n-butyl group, an i-butyl group, a sec-butyl group or a tert-butyl group, most preferably a methyl group.

n represents 0 or 1 and is preferably 1 and with this range, the edge roughness is more improved.

Specific examples of the repeating unit represented by formula (I) include the following compounds, however, the present invention is not limited to these specific examples.

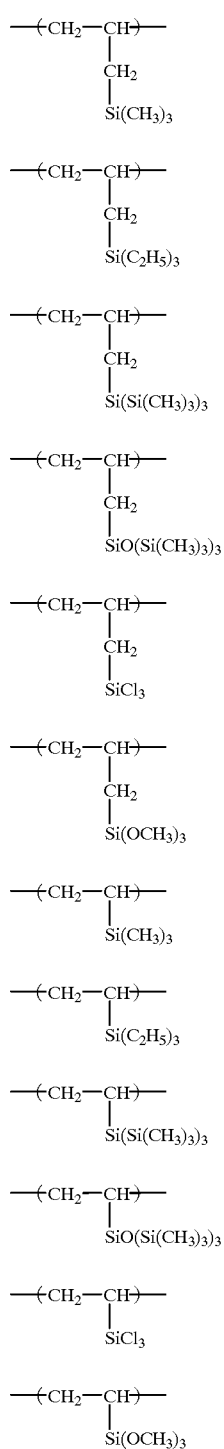

In the repeating unit (IIa), Y represents a group selected from a hydrogen atom, a methyl group, a cyano group and a chlorine atom. L represents a single bond or a divalent linking group. Q represents a hydrogen atom or a group capable of decomposing by an acid to generate a carboxylic acid.

The group capable of decomposing by an acid to generate a carboxylic acid is a group which decomposes and desorbs from the resin under the action of an acid generated from the component (B) upon exposure and generates a —COOH group. Specific examples of the group include a tertiary alkyl group such as tert-butyl group and tert-amyl group, a 1-alkoxyethyl group such as isobornyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofurfuryl group, a trialkylsilyl group, a 3-oxocyclohexyl group, a 2-methyl-adamantyl group, a mevalonic lactone residue and a 2-(γ-butyrolactonyloxycarbonyl)-2-propyl group In the repeating unit (IIb), $X^1$ and $X^2$ each independently represents a group selected from the group consisting of an oxygen atom, a sulfur atom, —NH— and —NHSO$_2$—. $L^1$ and $L^2$ each independently represents a single bond or a divalent linking group.

The divalent linking group represented by $L^1$ and $L^2$ is specifically a group selected from the group consisting of an alkylene group, a substituted alkylene group, an ether group, a thioether group, a carbonyl group, an ester group, an amido group, a sulfonamide group, a urethane group and a urea group, or a combination of two or more groups thereof.

The alkylene group and the substituted alkylene group of $L^1$ and $L^2$ include a group represented by the following formula:

$$-[C(Rd)(Re)]_r-$$

wherein Rd and Re, which may be the same or different, each represents a hydrogen atom, an alkyl group, a substituted alkyl group, a halogen atom, a hydroxyl group or an alkoxy group. The alkyl group is preferably a lower alkyl group such as methyl group, ethyl group, propyl group, isopropyl group and butyl group, more preferably a methyl group, an ethyl group, a propyl group or an isopropyl group. Examples of the substituent of the substituted alkyl group include a hydroxyl group, a halogen atom and an alkoxy group. The alkoxy group includes an alkoxy group having from 1 to 4 carbon atoms, such as methoxy group, ethoxy group, propoxy group and butoxy group. Examples of the halogen atom includes a chlorine atom, a bromine atom, a fluorine atom and an iodine atom. r represents an integer of 1 to 10.

$A^1$ and A2 each independently represents a hydrogen atom, a cyano group, a hydroxyl group, —COOH, —COOR', —CO—NH—R", an alkyl group which may be substituted, an alkoxy group, a cyclic hydrocarbon group or —COOQ', wherein R' and R" each independently represents an alkyl group which may have a substituent.

The alkyl group of $A^1$, $R^1$, R' and R" is preferably a linear or branched alkyl group having from 1 to 10 carbon atoms, more preferably a linear or branched alkyl group having from 1 to 6 carbon atoms, still more preferably a methyl group, an ethyl group, an n-propyl group, an i-propyl group, an n-butyl group, an i-butyl group, a sec-butyl group or a tert-butyl group. Also, the alkoxy group therefor is preferably a linear or branched alkoxy group having from 1 to 6 carbon atoms, more preferably a methoxy group, an ethoxy group, an n-propyloxy group, an i-propyloxy group, an n-butoxy group, an i-butoxy group, a sec-butoxy group or a tert-butoxy group, still more preferably a methoxy group or an ethoxy group. Examples of Q' include the same groups for Q in the repeating unit (IIa).

Examples of the additional substituent of the above-described alkyl or alkoxy group include a halogen atom such as fluorine, chlorine, bromine and iodine, and an alkoxy group such as methoxy, ethoxy, propoxy and butoxy.

Examples of the cyclic hydrocarbon group of $A^1$ and $A^2$ include a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornane epoxy group, a menthyl group, an isomenthyl group, a neomenthyl group and a tetracyclododecanyl group. The bond constituting the ring of these cyclic hydrocarbon groups may contain an ester bond or a carbonyl bond.

Examples of the additional substituent of the cyclic hydrocarbon group include a hydroxy group, a halogen atom, a carboxy group, an alkoxy group, an acyl group, a cyano group and an acyloxy group. Examples of the halogen atom include a chlorine atom, a bromine atom, a fluorine atom and an iodine atom; examples of the alkoxy group include an alkoxy group having from 1 to 4 carbon atoms, such as methoxy group, ethoxy group, propoxy group and butoxy group; examples of the acyl group include a formyl group and an acetyl group; and examples of the acyloxy group include an acetoxy group.

Specific examples of the repeating unit represented by formula (IIa) include the following compounds, however, the present invention is not to these specific examples.

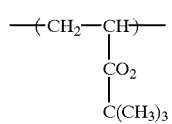
(IIa-1)

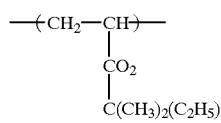
(IIa-2)

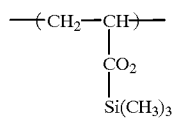
(IIa-3)

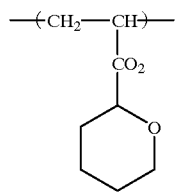
(IIa-4)

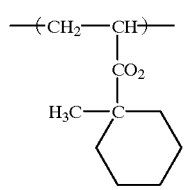
(IIa-5)

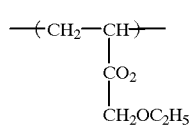
(IIa-6)

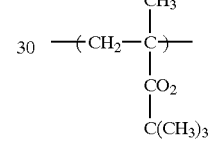
(IIa-7)

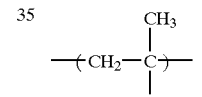
(IIa-8)

Specific examples of the repeating unit represented by formula (IIb) include the following compounds, however, the present invention is not limited to these specific examples.

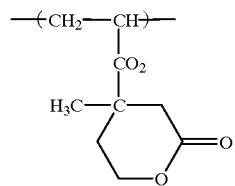
(IIa-9)

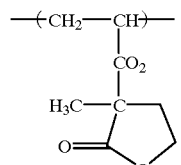
(IIa-10)

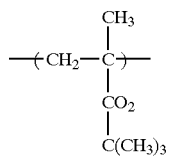
(IIa-11)

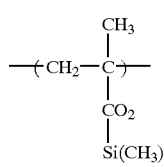
(IIa-12)

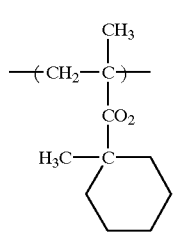
(IIa-13)

(IIa-14) 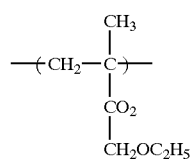
(IIa-15) 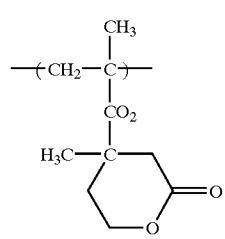
(IIa-16) 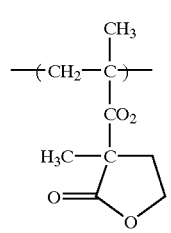
[I-1] 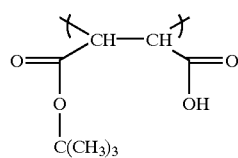
[I-2] 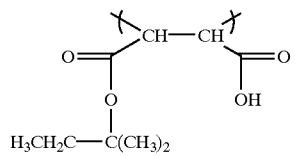
[I-3] 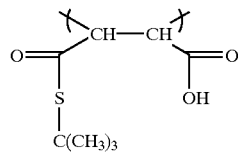
[I-4] 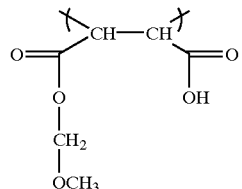
[I-5] 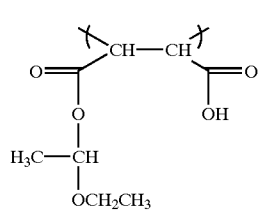
[I-6] 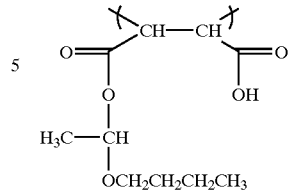
[I-7] 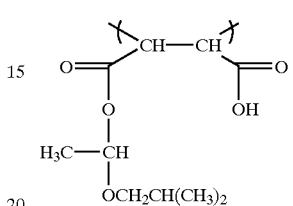
[I-8] 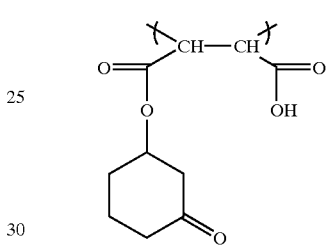
[I-9] 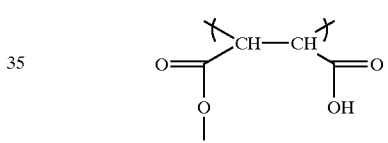
[I-10] 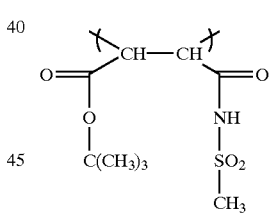
[I-11] 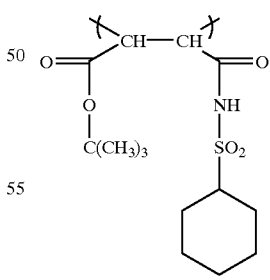
[I-12] 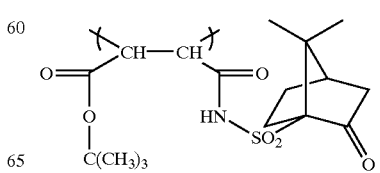

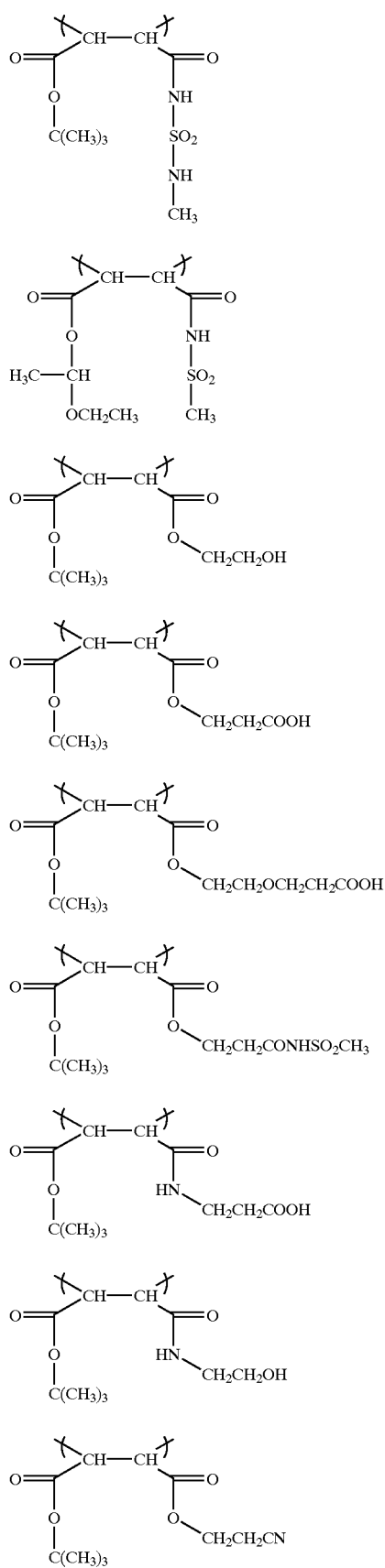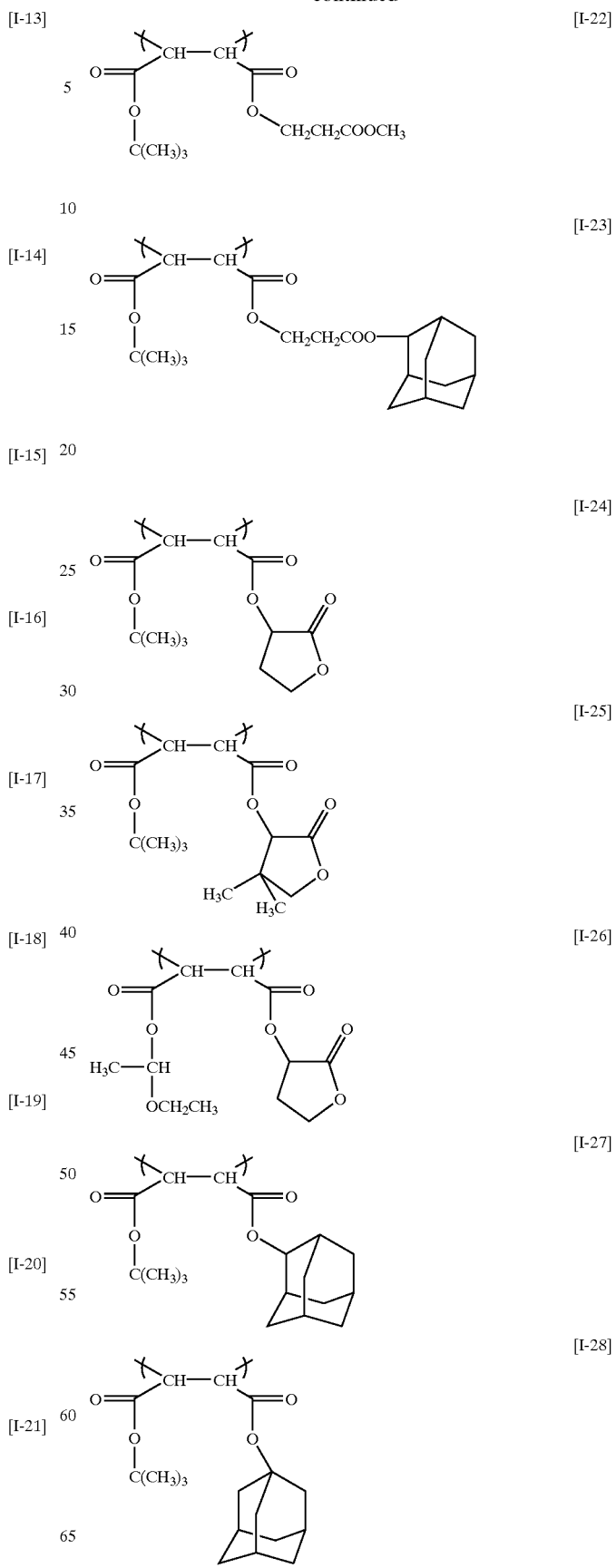

-continued
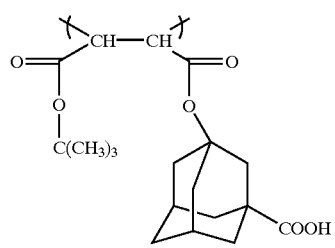
[I-29]
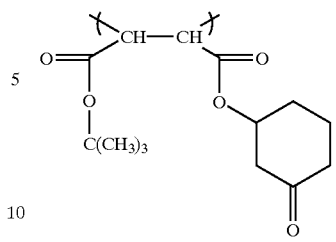
[I-37]
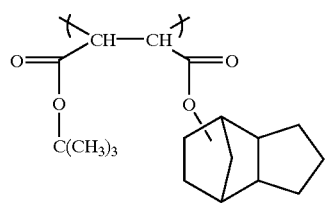
[I-30]
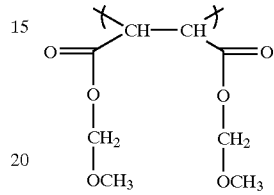
[I-38]
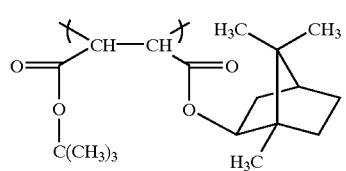
[I-31]
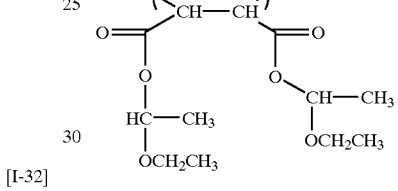
[I-39]
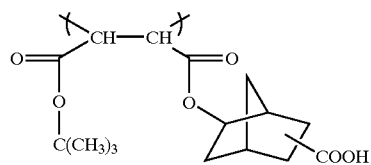
[I-32]
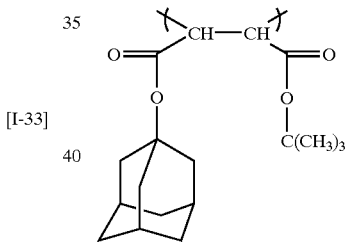
[I-40]
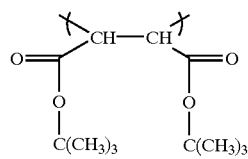
[I-33]
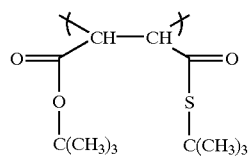
[I-34]
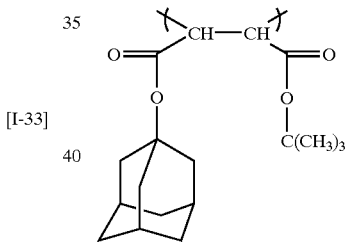
[I-41]
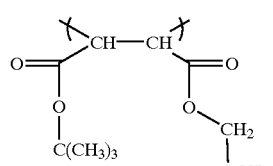
[I-35]
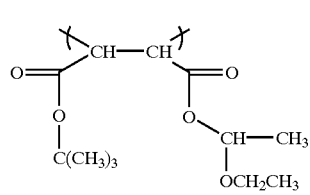
[I-36]
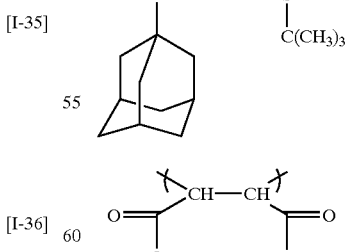
[I-42]

trihalomethyl group. The alkyl group of $R^4$ and $R^5$ is preferably a linear or branched alkyl group having from 1 to 10 carbon atoms, more preferably a linear or branched alkyl group having from 1 to 6 carbon atoms, still more preferably a methyl group, an ethyl group, an n-propyl group, an i-propyl group, an n-butyl group, an i-butyl group, a sec-butyl group or a tert-butyl group.

Specific examples of the repeating unit represented by formula (III) include the following compounds, however, the present invention is not limited to these specific examples.

The repeating unit (IV) has the following properties:
1) to be copolymerizable with monomers corresponding to the repeating units represented by formulae (I) to (III),
2) to contain at least one functional group selected from the group consisting of a group containing a lactone structure, a group containing a lactam structure, —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, wherein R, Ra and Rb each independently represents an alkyl or aryl group having from 1 to 10 carbon atoms, which may be substituted, and In the repeating unit (III), Z represents an oxygen atom or N—R$^4$, R$^4$ represents a hydrogen atom, a hydroxyl group, an alkyl group having a linear or branched chain or —O—SO$_2$—R$^5$, and R$^5$ represents an alkyl group or a 3) to be substantially incapable of decomposing by an acid.

In 1) above, "to be copolymerizable with monomers corresponding to the repeating units represented by formulae (I) to (III)" specifically means that when monomers corresponding to the repeating units represented by formulae (I) to (III) and a monomer corresponding to the repeating unit (IV) are polymerized in the co-presence a polymerization catalyst, a polymer containing the monomers corresponding to the repeating units represented by formula (I) to (IV) each in an amount of 1 mol % or more is always produced.

In 3) above, "to be substantially incapable of decomposing by an acid" includes the case of not decomposing at all or the case where even if decomposed, the decomposition ratio is low (less than 5 mol %).

In 2) above, examples of the group containing a lactone structure include a group containing a skeleton of β-propiolactone, γ-butyrolactone, δ-valerolactone or ε-caprolactone, which may have a substituent. Examples of the substituent here include a lower alkyl group such as methyl, ethyl and propyl, and a methoxy group.

Examples of the group containing a lactam structure include a group containing a skeleton of β-propiolactam, γ-butyrolactam, δ-valerolactam or ε-caprolactam, which may have a substituent. Examples of the substituent here include a lower alkyl group such as methyl, ethyl and propyl, and a methoxy group.

Examples of the alkyl or aryl group having from 1 to 10 carbon atoms, which may be substituted, represented by R, Ra and Rb include methyl, ethyl, n-propyl, i-propyl, n-butyl, i-butyl, sec-butyl, tert-butyl, n-pentyl, i-pentyl, n-hexyl, cyclohexyl, phenyl and naphthyl.

Further, examples of the further substituents for the alkyl or aryl group include a lower alkyl group such as methyl, ethyl and propyl and a methoxy group.

To be specifically, R is preferably a methyl group, an ethyl group, an n-propyl group, an i-propyl group, a cyclohexyl group or a phenyl group, more preferably a methyl group, an ethyl group, an n-propyl group, an i-propyl group or a cyclohexyl group, still more preferably a methyl group, an ethyl group, an n-propyl group or an i-propyl group.

Ra and Rb each is preferably a methyl group, an ethyl group, an n-propyl group, an i-propyl group, an i-butyl group, a sec-butyl group, a tert-butyl group, a cyclohexyl group or a phenyl group, more preferably a methyl group, an ethyl group, an n-propyl group, an n-butyl group, a cyclohexyl group or a phenyl group, still more preferably a methyl group, an ethyl group, an n-propyl group or a cyclohexyl group.

The repeating unit (IV) is preferably a repeating unit represented by formula (IV).

In formula (IV), Y represents a group selected from the group consisting of a hydrogen atom, a methyl group, a cyano group and a chlorine atom. $X^3$ represents a group selected from —$CO_2$—, —O— and —CON(R)—, wherein R has the same meaning as above. $L^3$ represents a single bond or a divalent linking group. $A^3$ represents a group represented by formula (V) or (VI).

In formula (V), $X^4$ represents an alicyclic hydrocarbon group which may contain a carbonyl bond or an ester bond within the ring. Each Rc independently represents a hydrogen atom, an alkyl group, an alkyl group containing as a substituent at least one functional group selected from the group consisting of —OH, —$OCH_3$, —OCORa, —NHCORa, —$NHSO_2$Ra, —N(R)CORa, —N(R)$SO_2$Ra—, —COOH, —COORa, —CONHRa, —$CONHSO_2$Ra, —CON(R)$SO_2$Ra, —CON(Ra) (Rb) and —CN, or a group selected from the group consisting of —OH, —$OCH_3$, —OCORa, —NHCORa, —$NHSO_2$Ra, —N(R)CORa, —N(R)$SO_2$Ra, —COOH, —COORa, —CONHRa, —$CONHSO_2$Ra, —CON(R)$SO_2$Ra, —CON (Ra) (Rb) and —CN, wherein R, Ra and Rb each has the same meaning as above. m1 represents an integer of 0 to 5.

In formula (VI), Rc1 and Rc3 each independently represents a hydrogen atom, an alkyl group having from 1 to 10 carbon atoms, which may be substituted, an alkyl group containing as a substituent at least one functional group selected from the group consisting of —OH, —$OCH_3$, —OCORa, —NHCORa, —$NHSO_2$Ra, —N(R)CORa, —N(R)$SO_2$Ra—, —COOH, —COORa, —CONHRa, —$CONHSO_2$Ra, —CON(R)$SO_2$Ra, —CON(Ra) (Rb) and —CN, or a group selected from the group consisting of —COOH, —COORa, —CONHRa, —$CONHSO_2$Ra, —CON(R)$SO_2$Ra, —CON(Ra) (Rb) and —CN, provided that Rc1 and Rc3 are not simultaneously hydrogen. Rc2 represents a group selected from the group consisting of —OH, —$OCH_3$, —OCORa, —NHCORa, —$NHSO_2$Ra, —N(R)CORa, —N(R)$SO_2$Ra, —COOH, —COORa, —CONHRa, —$CONHSO_2$Ra, —CON(R)$SO_2$Ra, —CON (Ra) (Rb) and —CN. R, Ra and Rb each has the same meaning as above.

In formula (IV), $X^3$ is preferably —$CO_2$— or —CONH—, more preferably —$CO_2$—.

The divalent linking group represented by $L^3$ is specifically a group selected from the group consisting of an alkylene group, a substituted alkylene group, an arylene group, a substituted arylene group, an ether group, a thioether group, a carbonyl group, an ester group, an amido group, a sulfonamide group, a urethane group and a urea group, or a combination of two or more groups thereof. The alkylene group and the substituted alkylene group of $L^3$ include a group represented by the following formula:

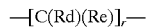

In this formula, Rd and Re each independently represents a hydrogen atom, an alkyl group, a substituted alkyl group, a halogen atom, a hydroxyl group or an alkoxy group. The alkyl group is preferably a lower alkyl group such as methyl group, ethyl group, n-propyl group, i-propyl group and n-butyl group, more preferably a methyl group, an ethyl group, an n-propyl group or an i-propyl group. Examples of the substituent of the substituted alkyl group include a hydroxyl group, a halogen atom and an alkoxy group. The alkoxy group includes an alkoxy group having from 1 to 4 carbon atoms, such as methoxy group, ethoxy group, propoxy group and butoxy group. Examples of the halogen atom includes a chlorine atom, a bromine atom, a fluorine atom and an iodine atom. r represents an integer of 1 to 10.

Examples of the arylene group in the arylene group and the substituted arylene group of $L^3$ include a o-phenylene group, an m-phenylene group, a p-phenylene group, a 2,3-naphthylene group, a 2,6-naphthylene group and a 2,7-naphthylene group. Among these, an o-phenylene group, an m-phenylene group and a p-phenylene group are preferred, and an m-phenylene group and a p-phenylene group are more preferred.

The amide group, the sulfonamide group, the urethane group and the urea group of $L^3$ each may have a substituent on the nitrogen atom thereof. Examples of the substituent on the nitrogen atom include a hydrogen atom and an alkyl group. The alkyl group is preferably a lower alkyl group such as methyl group, ethyl group, n-propyl group, i-propyl group and n-butyl group, more preferably a methyl group, an ethyl group, an n-propyl group or an i-propyl group.

In formula (V), specific examples of the alicyclic hydrocarbon group of $X^4$ include residues of γ-butyrolactone, tetrahydrofuran, δ-valerolactone, tetrahydropyrane, adamantane, norbornane and isobornane. Among these, preferred rings are γ-butyrolactone, δ-valerolactone and adamantane.

The alkyl group or the alkyl group in the alkyl group having a substituent of Rc includes an alkyl group having from 1 to 10 carbon atoms and specific examples thereof include methyl, ethyl, n-propyl, i-propyl, n-butyl, n-pentyl, n-hexyl and cyclohexyl.

Rc is preferably a hydrogen atom, methyl, ethyl, —OH, —OCH$_3$, —COOH, —COOCH$_3$ or —CN, more preferably a hydrogen atom, methyl, —OH, —COOH or —CN. m1 is preferably a number of 1 to 4, more preferably 2 or 3.

Specific examples of the alkyl group or the alkyl group in the alkyl group having a substituent of Rc1 and Rc3 in formula (VI) include methyl, ethyl, n-propyl, i-propyl, n-butyl, n-pentyl, n-hexyl and cyclohexyl.

Rc1 and Rc3 each is preferably a hydrogen atom, a methyl group, an ethyl group, an n-propyl group, an n-butyl group, a cyclohexyl group, —CH$_2$OH, —CH$_2$OCH$_3$, —COOH, —COOCH$_3$, —CH$_2$COOH or —CH$_2$COOCH$_3$, more preferably a hydrogen atom, a methyl group, an ethyl group, an n-propyl group, a cyclohexyl group, —CH$_2$OH, —CH$_2$OCH$_3$, —COOH or —COOCH$_3$, more preferably a hydrogen atom, a methyl group, an ethyl group, —CH$_2$OH, —CH$_2$OCH$_3$, —COOH or —COOCH$_3$.

Rc2 is preferably —OH, —OCH$_3$, —COOH, —COOCH$_3$ or —CN, more preferably —OH, —COOH or —CN.

$A^3$ in formula (IV) is preferably a group represented by formula (V). In particular, the group represented by formula (V) is more preferably a group represented by formula (VII), most preferably a group represented by formula (VIII) or (IX).

In formula (VII), $X^5$ represents a group selected from —C(=O)—O— and —C(=O)—. Rc has the same meaning as above.

$m^5$ represents an integer of 0 to 2.

In formula (VII), $X^5$ is preferably —CO—O—; Rc is preferably a hydrogen atom, methyl, ethyl, —OH, —OCH$_3$, —COOH, —COOCH$_3$ or —CN, more preferably a hydrogen atom, methyl, —OH, —COOH or —CN; m1 is preferably a number of 0 to 2; and m5 is preferably 0 or 1.

Specific examples of the repeating unit containing the group represented by formula (V) include the following compounds, however, the present invention is not limited to these specific examples.

Examples of Formula (V):

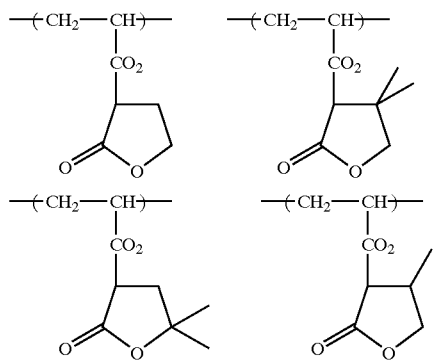

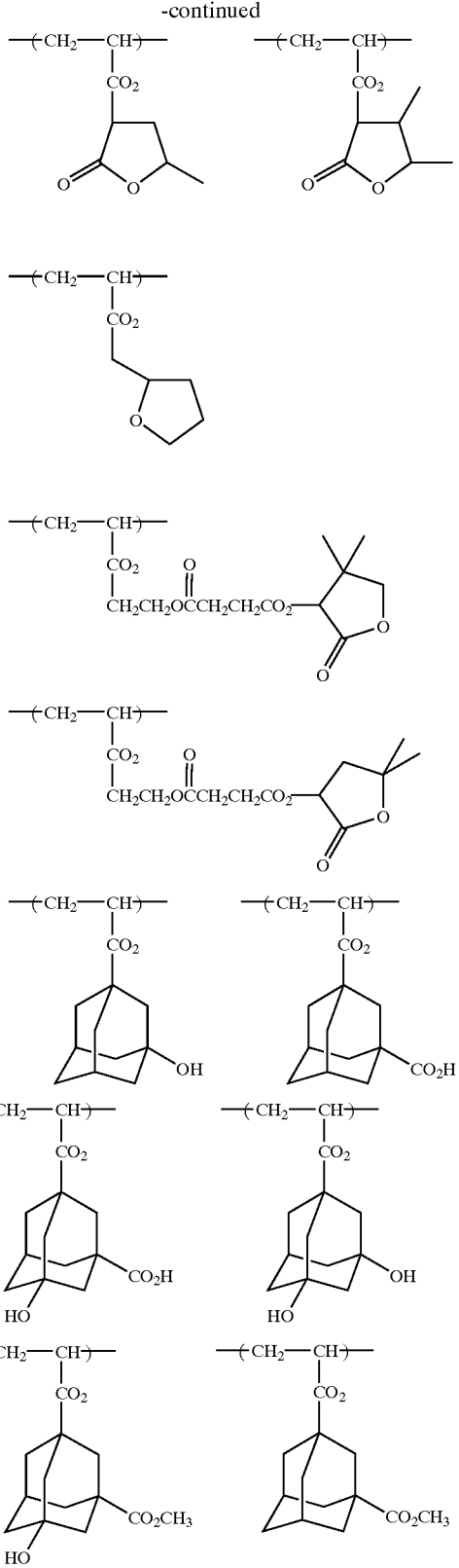

Specific examples of the repeating unit containing the group represented by formula (VI) include the following compounds, however, the present invention is not limited to these specific examples.

Examples of Formula (VI):

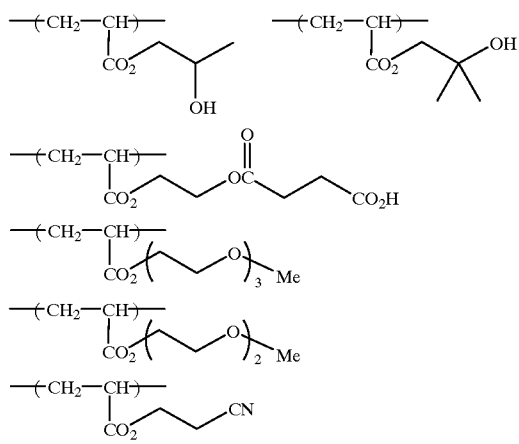

Specific examples of the repeating unit containing the group represented by formula (VII) include the following compounds, however, the present invention is not limited to these specific examples.

Examples of Formula (VII):

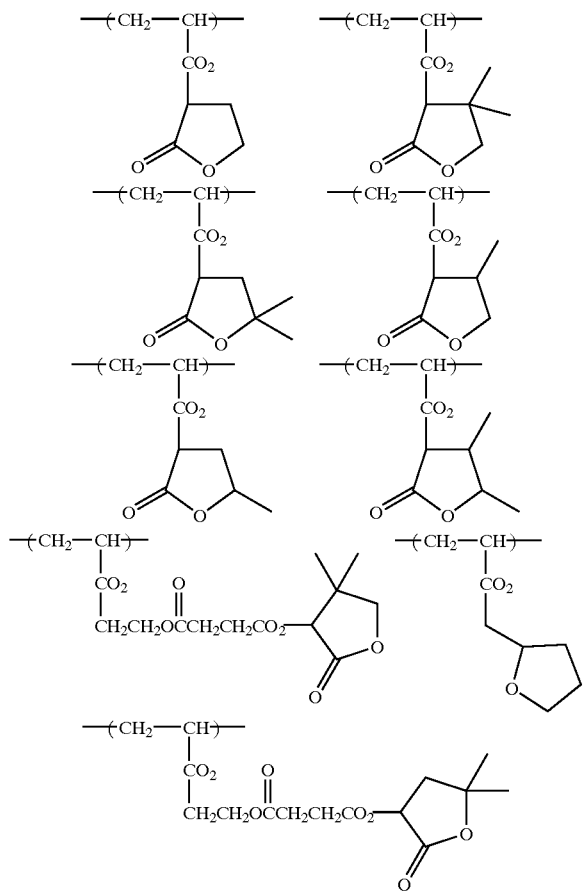

In the resin (A) for use in the present invention, the contents of the repeating unit represented by formula (I), at least one repeating unit out of the repeating units (IIa) and (IIb), and the repeating unit represented by formula (III) may be appropriately selected by taking account of the desired oxygen plasma etching resistance of the resist, the sensitivity, the capability of preventing cracking of the pattern, the adhesion to the substrate, the resist profile and as the factors generally required for resists, the resolution, heat resistance and the like.

In the resin (A) for use in the present invention, the content of the repeating unit represented by formula (I) is generally from 10 to 90 mol %, preferably from 15 to 70 mol %, more preferably from 20 to 50 mol %, based on all repeating units.

The content of at least one repeating unit out of the repeating units (IIa) and (IIb) is from 5 to 50 mol %, preferably from 10 to 40 mol %, based on all repeating units.

The content of the repeating unit (III) is from 10 to 90 mol %, preferably from 15 to 70 mol %, more preferably from 20 to 60 mol %, based on all repeating units.

The content of the repeating unit (IV) is from 3 to 40 mol %, preferably from 5 to 30 mol %, based on all repeating units.

The resin (A) for use in the present invention can be obtained by copolymerizing a monomer corresponding to the repeating unit represented by formula (I), a monomer corresponding to at least one repeating unit out of the formulae (IIa) and (IIb), a monomer corresponding to the repeating unit represented by formula (III), and a monomer corresponding to the repeating unit represented by formula (IV), in the presence of a polymerization catalyst. In another method, after a monomer corresponding to the repeating unit represented by formula (I), a monomer corresponding to the repeating unit of formula (IIa) and a maleic anhydride are copolymerized or after a monomer corresponding to the repeating unit represented by formula (I) and a maleic anhydride are copolymerized, the repeating unit derived from maleic anhydride in the obtained copolymer is partially open-ring esterified or hydrolyzed with an alcohol under basic or acidic conditions.

The resin according to the present invention preferably has a weight average molecular weight of 1,000 to 200,000 on a polystyrene basis by GPC method. If the weight average molecular weight is less than 1,000, the heat resistance or the dry etching resistance decreases and this is not preferred, whereas if it exceeds 200,000, the developability is deteriorated or due to an extremely high viscosity, disadvantageous results come out, for example, the film-forming property changes for the worse.

In the positive photoresist composition of the present invention, the amount of the resin (A) according to the present invention blended in the entire composition is preferably from 40 to 99.99 wt %, more preferably from 50 to 99.97 wt %, based on all solid contents in the resist.

The compound (B) capable of generating an acid upon irradiation with actinic rays or radiation is described below.

Examples of the compound capable of decomposing and upon irradiation with actinic rays or radiation and thereby generating an acid, which can be used, include a photoinitiator for photocationic polymerization, a photoinitiator for photoradical polymerization, a photo-decoloring agent for dyes, a photo-discoloring agent and a compound capable of generating an acid upon irradiation with known light used for microresist or the like (for example, ultraviolet or far ultraviolet ray of 200 to 400 nm, preferably g line, h line, i line or a KrF excimer laser ray) or with an ArF excimer laser ray, an electron beam, an X ray, a molecular beam or an ion beam. The compound may be appropriately selected from these and a combination thereof.

Other examples of the compound capable of generating an acid upon irradiation with actinic rays or radiation for use in the present invention include onium salts such as diazonium salts described in S. I. Schlesinger, *Photogr. Sci. Eng.*, 18, 387 (1974), T. S. Bal et al., *Polymer*, 21, 423 (1980), etc., ammonium salts described in U.S. Pat. Nos. 4,069,055, 4,069,056 and Re27,992, JP-A-3-140140, etc., phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988), U.S. Pat. Nos. 4,069,055 and 4,069,056, etc., iodonium salts described in J. V. Crivello et al., *Macromolecules*, 10 (6) 1307 (1977), *Chem. & Eng. News*, November 28, p. 31 (1988), European Patents 104,143, 339,049 and 410,201, JP-A-2-150848, JP-A-2-296514, etc., sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patent 2,904, 626, 3,604,580 and 3,604,581, JP-A-7-28237, JP-A-8-27102, etc., selenonium salts described in J. V. Crivello et al., *Macromolecules*, 10 (6), 1307 (1977), J. V. Crivello et al., *J. Polymer Sci., Polymer Chem. Ed.*, 17, 1047 (1979), etc., and arsonium salts described in C. S. Wen et al., *Teh, Proc. Conf. Rad. Curing ASIA*, p. 478, Tokyo, October (1988), etc.; organic halogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), JP-A-2-161445, etc.; photo-acid generators having an O-nitrobenzyl type protective group described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290,750, 046,083, 156,535, 271,851 and 0,388, 343, U.S. Pat. Nos. 3,901,710 and 4,181,531, JP-A-60-198538, JP-A-53-133022, etc.; compounds which are photochemically decomposed to generate sulfonic acid, represented by iminosulfonate, described in M. TUNOOKA et al., *Polymer Preprints Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0,199,672, 84,515, 044,115, 618,564 and 0,101,122, U.S. Pat. Nos. 4,371,605 and 4,431, 774, JP-A-64-18143, JP-A-2-245756, JP-A-3-140109, etc.; disulfone compounds described in JP-A-61-166544, JP-A-2-71270, etc.; and diazoketosulfone and diazosulfone compounds described in JP-A-3-103854, JP-A-3-103856 and JP-A-4-210960, etc.

In addition, compounds in which the above-described group or compound capable of generating an acid by light is introduced into the main chain or side chain may also be used and examples thereof include the compounds described in M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc.

Furthermore, the compounds capable of generating an acid by light, described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, European Patent 126,712, etc. may also be used.

Among these compounds capable of decomposing upon irradiation with actinic rays or radiation and thereby generating an acid, particularly effective compounds are described below.

(1) Oxazole derivative represented by the following formula (PAG1) and S-triazine derivative represented by the following formula (PAG2), which are each substituted by trihalomethyl group:

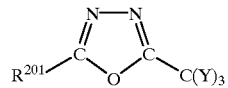

(PAG1)

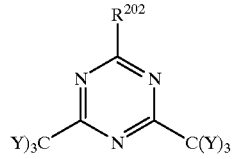

(PAG2)

wherein $R^{201}$ represents a substituted or unsubstituted aryl group or a substituted or unsubstituted alkenyl group, $R^{202}$ represents a substituted or unsubstituted aryl group, a substituted or unsubstituted alkenyl group, a substituted or unsubstituted alkyl group or $-C(Y)_3$, and Y represents a chlorine atom or a bromine atom.

Specific examples thereof include the following compounds, however, the present invention is by no means limited thereto.

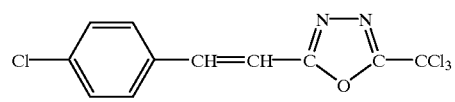

(PAG1-1)

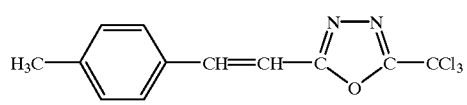

(PAG1-2)

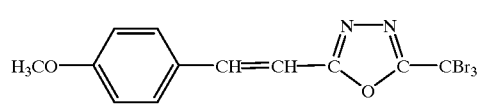

(PAG1-3)

-continued
(PAG1-4)
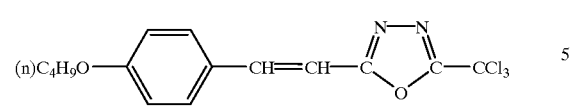
(PAG1-5)
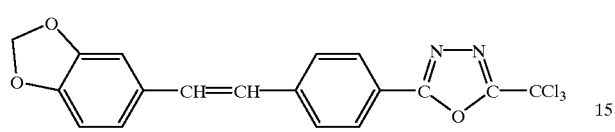
(PAG1-6)
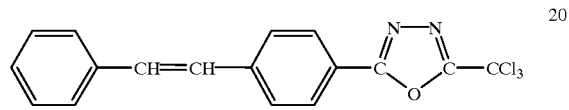
(PAG1-7)
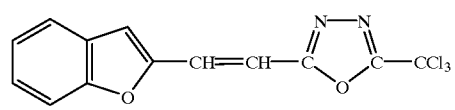
(PAG1-8)
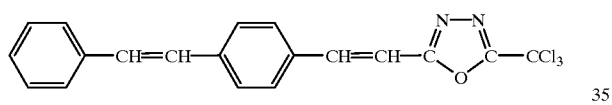
(PAG2-1)
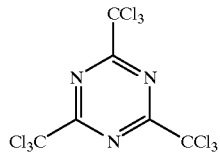
(PAG2-2)
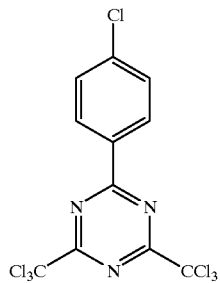
(PAG2-3)
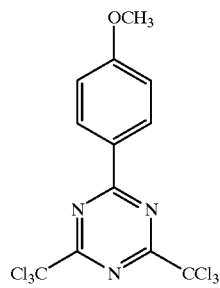
-continued
(PAG2-4)
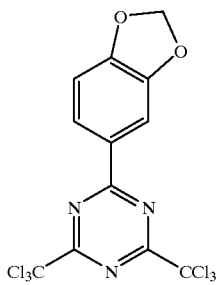
(PAG2-5)
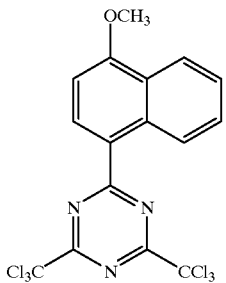
(PAG2-6)
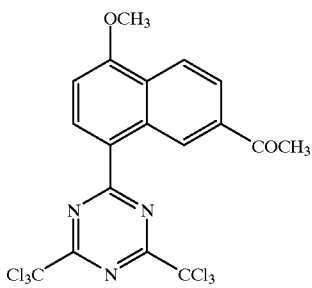
(PAG2-7)
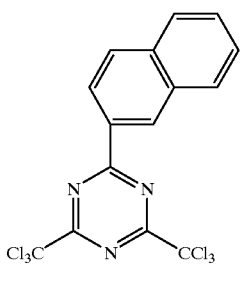
(PAG2-8)
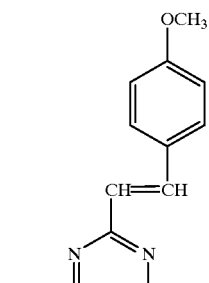
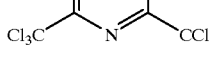

-continued (PAG2-9)

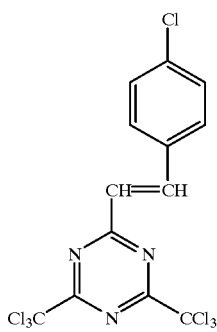

(PAG2-10)

(2) Iodonium salt represented by the following formula (PAG3) and sulfonium salt represented by the following formula (PAG4):

(PAG3)

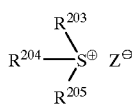

(PAG4)

$$R^{204}-\underset{R^{205}}{\overset{R^{203}}{S^{\oplus}}}\ Z^{\ominus}$$

In formula (PAG3), $Ar^1$ and $Ar^2$ each independently represents a substituted or unsubstituted aryl group. The substituent is preferably an alkyl group, a haloalkyl group, a cycloalkyl group, an aryl group, an alkoxy group, a nitro group, a carboxyl group, an alkoxycarbonyl group, a hydroxy group, a mercapto group or a halogen atom.

In formula (PAG4), $R^{203}$, $R^{204}$ and $R^{205}$ each independently represents a substituted or unsubstituted alkyl group or a substituted or unsubstituted aryl group, and preferably an aryl group having from 6 to 14 carbon atoms, an alkyl group having from 1 to 8 carbon atoms or a substituted derivative thereof. The substituent of the substituted aryl group is preferably an alkoxy group having from 1 to 8 carbon atoms, an alkyl group having from 1 to 8 carbon atoms, a nitro group, a carboxyl group, a hydroxy group or a halogen atom, and the substituent of the substituted alkyl group is preferably an alkoxy group having from 1 to 8 carbon atoms, a carboxyl group or an alkoxycarbonyl group.

In formulae (PAG3) and (PAG4), $Z^-$ represents a counter anion and examples thereof include perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, condensed polynuclear aromatic sulfonate anion such as pentafluorobenzene sulfonate anion and naphthalene-1-sulfonate anion, anthraquinone sulfonate anion and sulfonic acid group-containing dye, but the present invention is not limited thereto.

Two of $R^{203}$ $R^{204}$ and $R^{205}$ or $Ar^1$ and $Ar^2$ may be connected through a single bond or a substituent.

Specific examples thereof include the following compounds, however, the present invention is by no means limited thereto.

(PAG3-1)

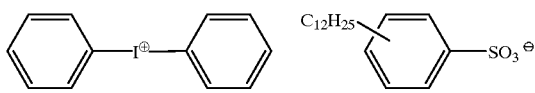

(PAG3-2)

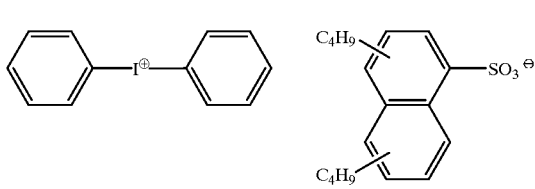

(PAG3-3)

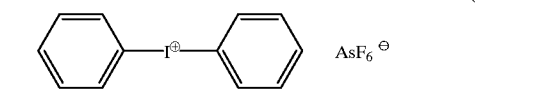

(PAG3-4)

(PAG3-5)

(PAG3-6)

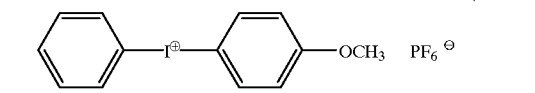

(PAG3-7)

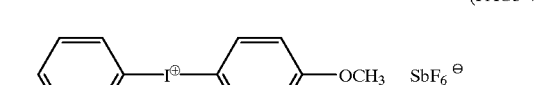

(PAG3-8)

(PAG3-9)

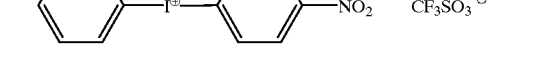

-continued
(PAG3-10)
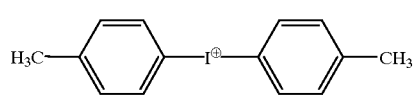 AsF$_6^\ominus$
(PAG3-11)
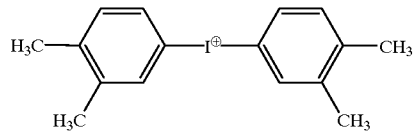 SbF$_6^\ominus$
(PAG3-12)
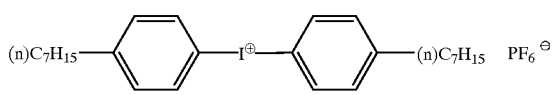 PF$_6^\ominus$
(PAG3-13)
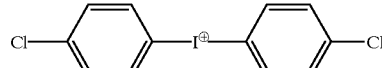
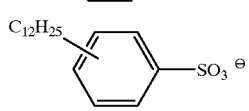
(PAG3-14)
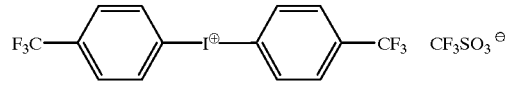 CF$_3$SO$_3^\ominus$
(PAG3-15)
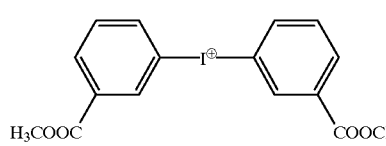 PF$_6^\ominus$
(PAG3-16)
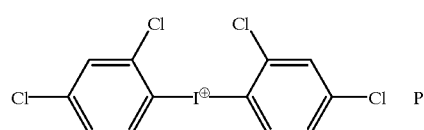 PF$_6^\ominus$
(PAG3-17)
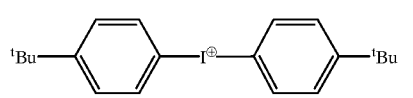 SbF$_6^\ominus$
(PAG3-18)
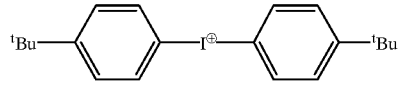
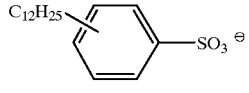
(PAG3-19)
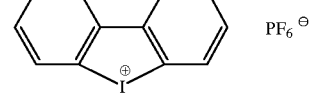 PF$_6^\ominus$
-continued
(PAG3-20)
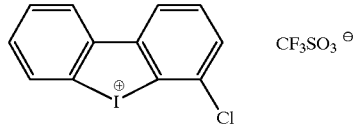 CF$_3$SO$_3^\ominus$
(PAG3-21)
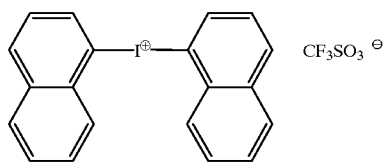 CF$_3$SO$_3^\ominus$
(PAG3-22)
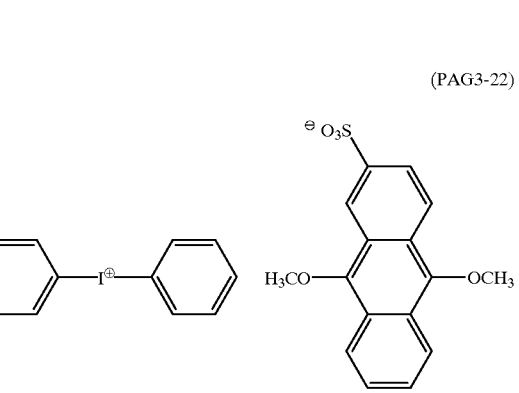
(PAG3-23)
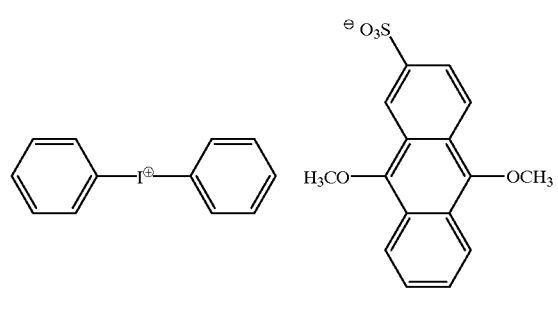
(PAG3-24)
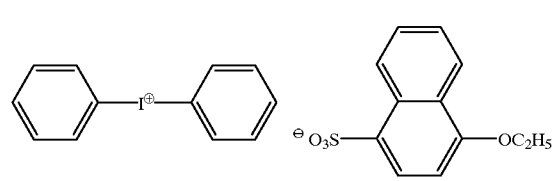
(PAG3-25)
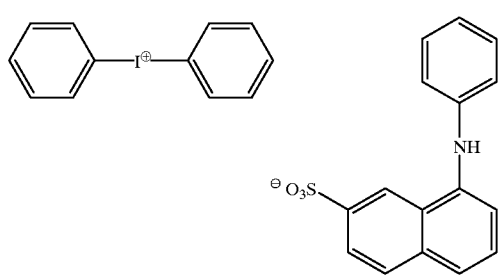
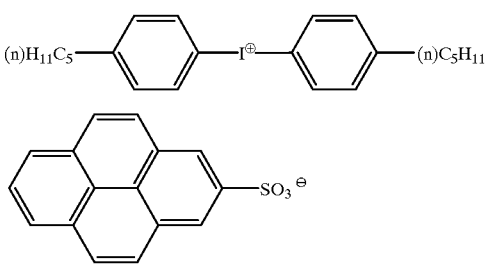

(PAG3-26)
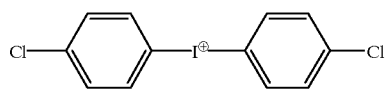
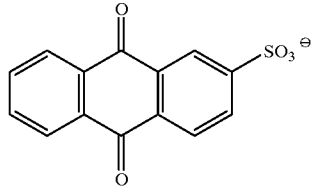
(PAG3-27)
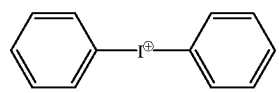
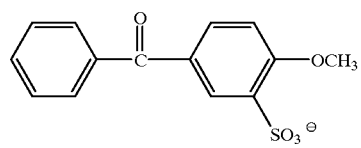
(PAG3-28)
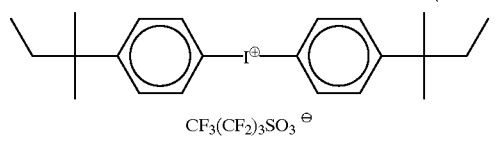
(PAG3-29)
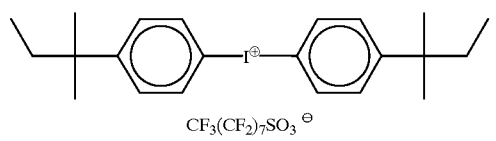
(PAG4-1)
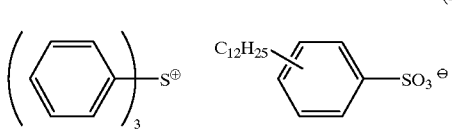
(PAG4-2)
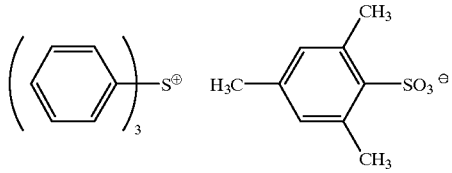
(PAG4-3)
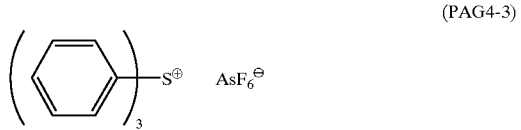
(PAG4-4)
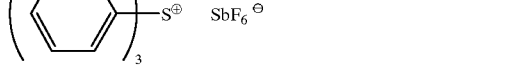
(PAG4-5)
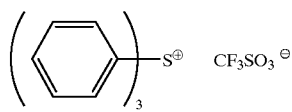
(PAG4-6)
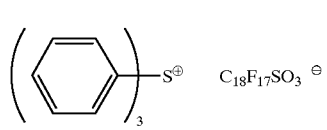
(PAG4-7)
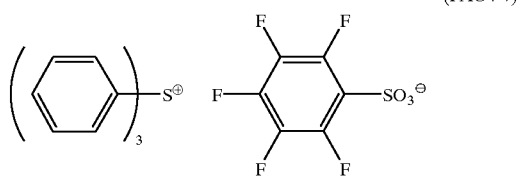
(PAG4-8)
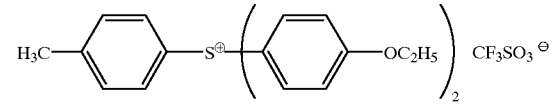
(PAG4-9)
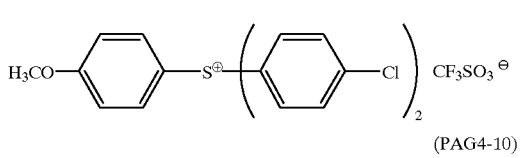
(PAG4-10)
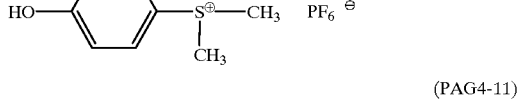
(PAG4-11)
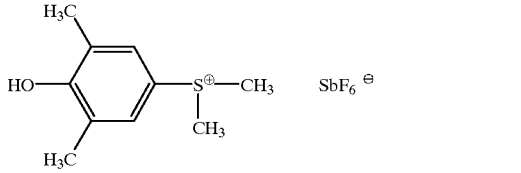
(PAG4-12)
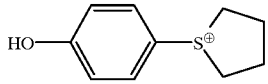
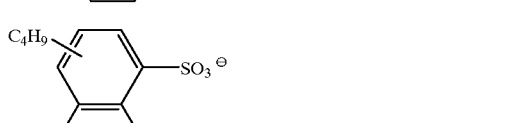
(PAG4-13)

-continued
(PAG4-14)
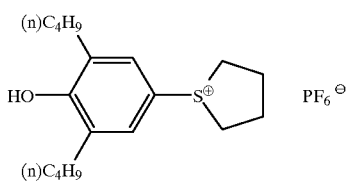
(PAG4-15)
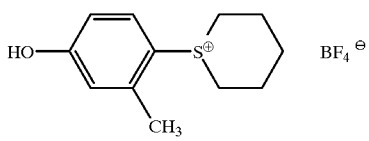
(PAG4-16)
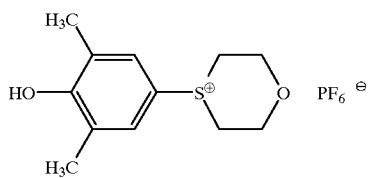
(PAG4-17)
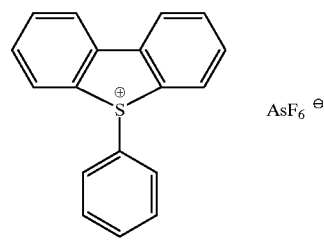
(PAG4-18)
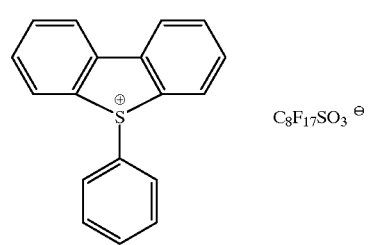
(PAG4-19)
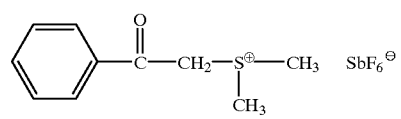
(PAG4-20)
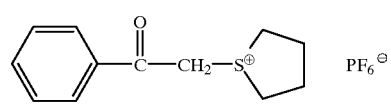
(PAG4-21)
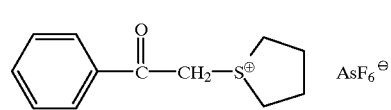
(PAG4-22)
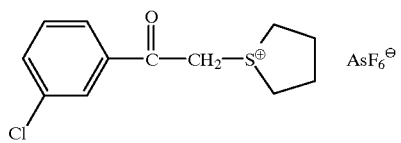
-continued
(PAG4-23)
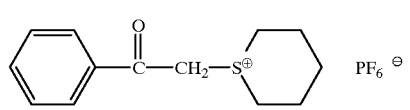
(PAG4-24)
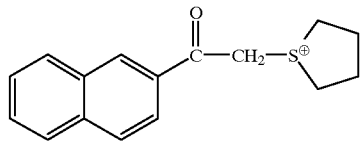
(PAG4-25)
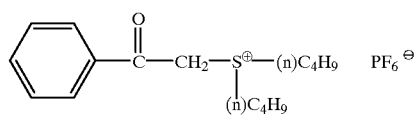
(PAG4-26)
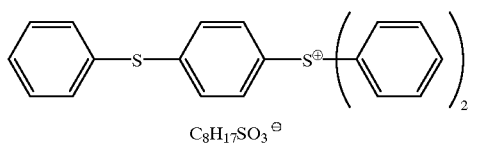
(PAG4-27)
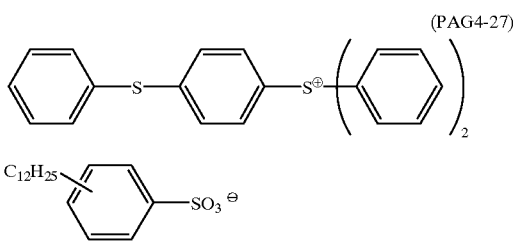
(PAG4-28)
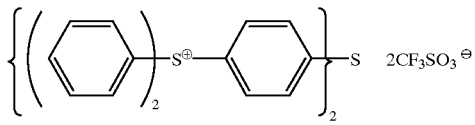
(PAG4-29)
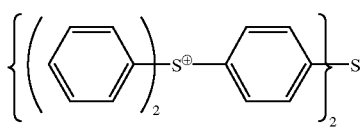
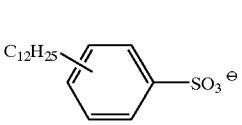
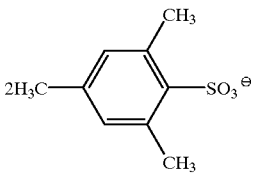

(PAG4-30) 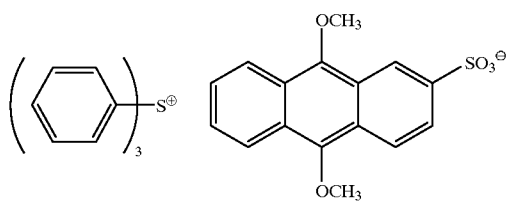

(PAG4-31) 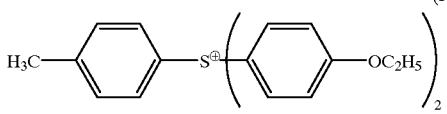

(PAG4-32) 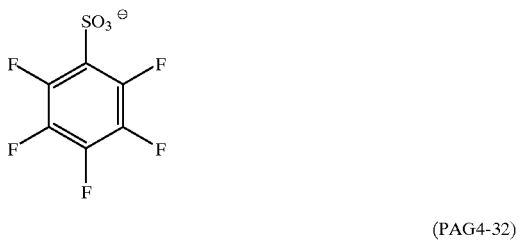

(PAG4-33) 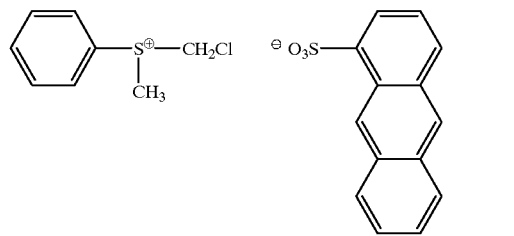

(PAG4-34) 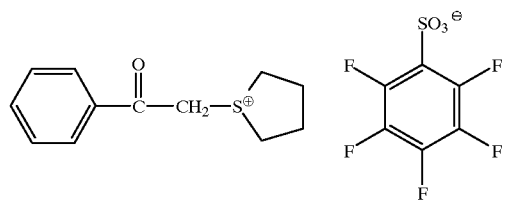

(PAG4-35) 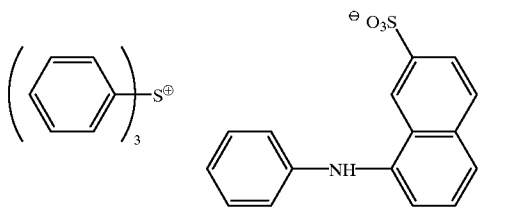

(PAG4-36) 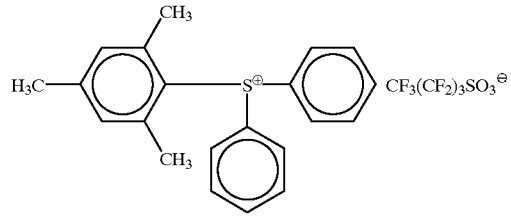

(PAG4-37) 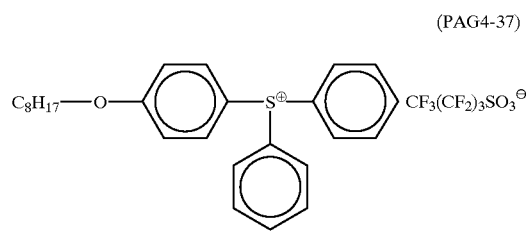

The above-mentioned onium salts represented by formulae (PAG3) and (PAG4) are known and can be synthesized by the method described, for example, in J. W. Knapczyl et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Am. Chem. Soc.*, 51, 3587 (1929), J. V. Crivello et al., *J. Polym. Chem. Ed.*, 18, 2677 (1980), U.S. Pat. Nos. 2,807,648 and 4,247,473, JP-A-53-101331, etc.

(3) Disulfonic acid derivative represented by the following formula (PAG5) and iminosulfonate derivative represented by formula (PAG6):

$$Ar^3—SO_2—SO_2—Ar^4 \quad (PAG5)$$

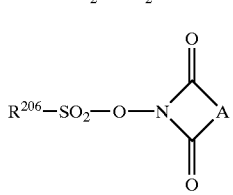 (PAG6)

wherein $Ar^3$ and $Ar^4$ each independently represents a substituted or unsubstituted aryl group, $R^{206}$ represents a substituted or unsubstituted alkyl group or a substituted or unsubstituted aryl group, A represents a substituted or unsubstituted alkylene group, a substituted or unsubstituted alkenylene group or a substituted or unsubstituted arylene group.

Specific examples thereof include the following compounds, however, the present invention is by no means limited thereto.

(PAG5-1) 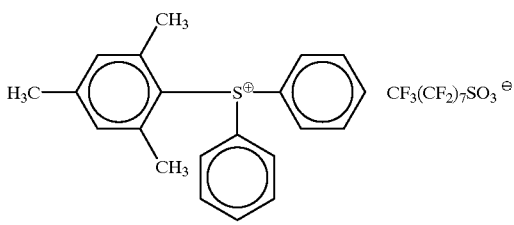

(PAG5-2)
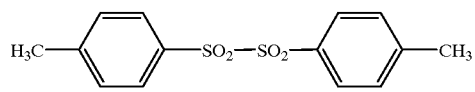
(PAG5-3)
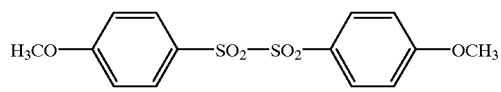
(PAG5-4)
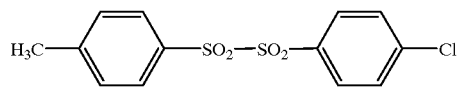
(PAG5-5)
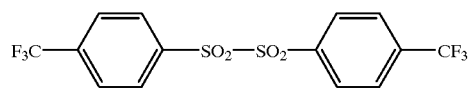
(PAG5-6)
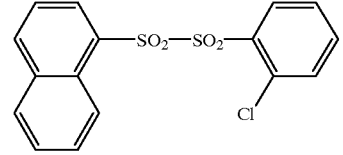
(PAG5-7)
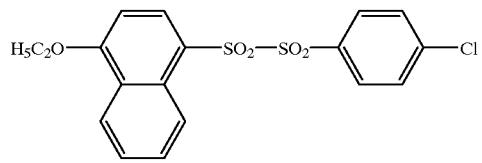
(PAG5-8)
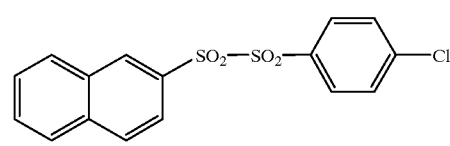
(PAG5-9)
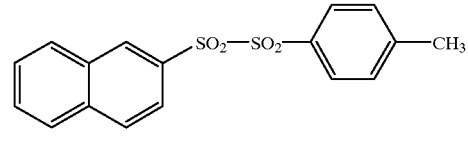
(PAG5-10)
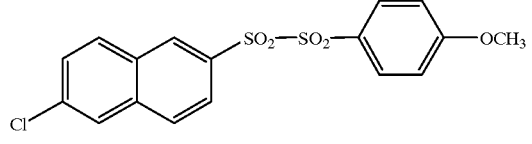
(PAG5-11)
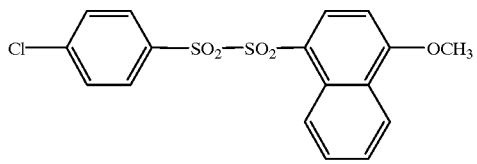
(PAG5-12)
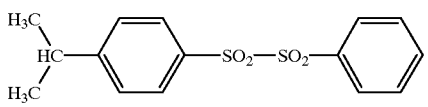
(PAG5-13)
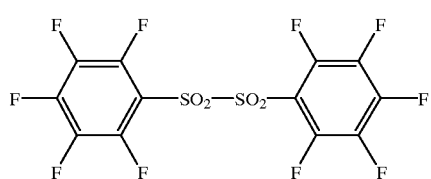
(PAG5-14)
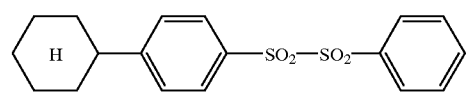
(PAG5-15)
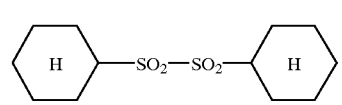
(PAG6-1)
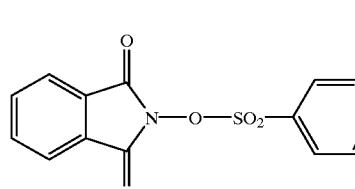
(PAG6-2)
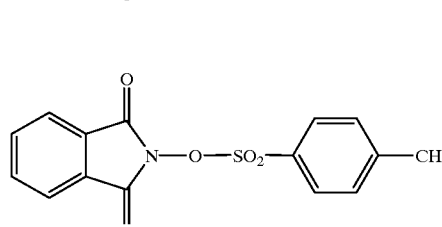
(PAG6-3)
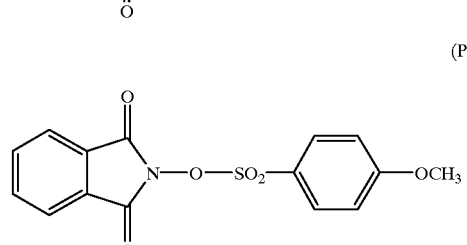

(PAG6-4)
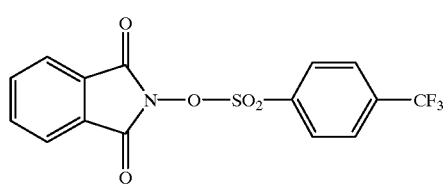
(PAG6-5)
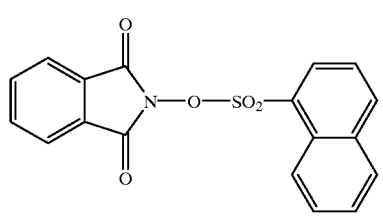
(PAG6-6)
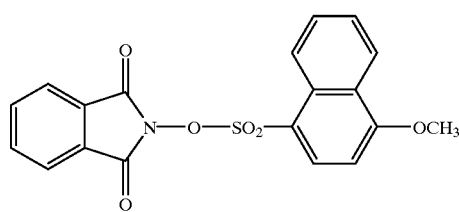
(PAG6-7)
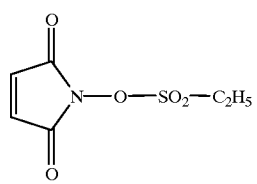
(PAG6-8)
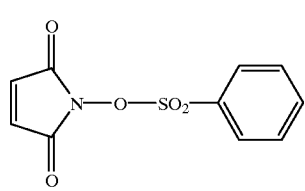
(PAG6-9)
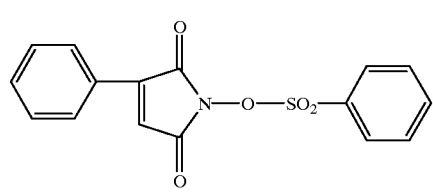
(PAG6-10)
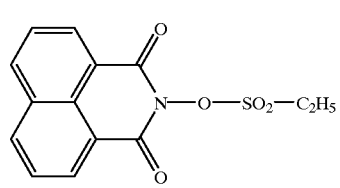
(PAG6-11)
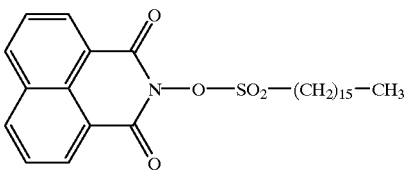
(PAG6-12)
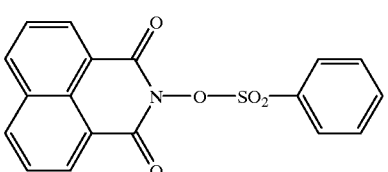
(PAG6-13)
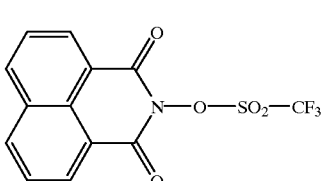
(PAG6-14)
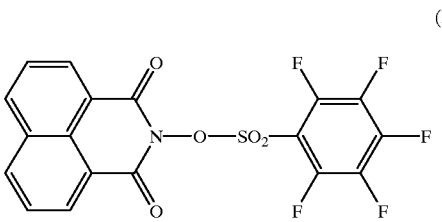
(PAG6-15)
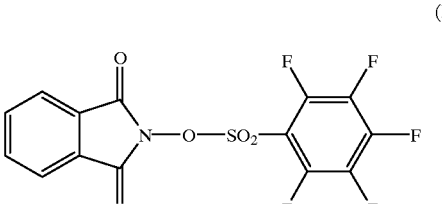
(PAG6-16)
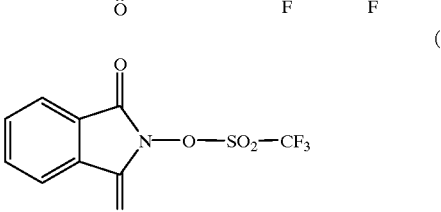
(PAG6-17)
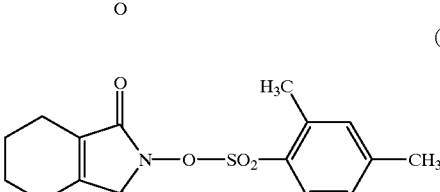
(PAG6-18)
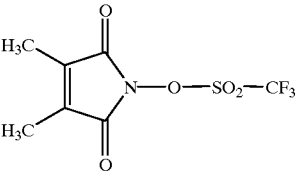

(PAG6-19)

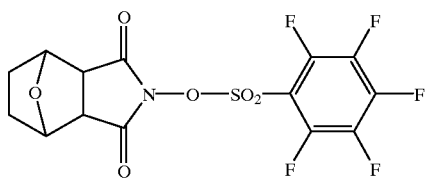

(4) Diazodisulfone derivative compound represented by the following formula (PAG7)

(PAG7)

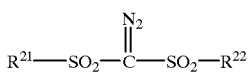

wherein $R^{21}$ and $R^{22}$ each independently represents an alkyl group which may have a substituent, a cycloalkyl group or an aryl group which may have a substituent.

The alkyl group is preferably a linear or branched alkyl group having from 1 to 20 carbon atoms, more preferably a linear or branched alkyl group having from 1 to 12 carbon atoms. The cycloalkyl group is preferably a cyclopentyl group or a cyclohexyl group. The aryl group is preferably an aryl group having from 6 to 10 carbon atoms, which may have a substituent. Examples of the substituent here include an alkyl group such as methyl group, ethyl group, n-propyl group, i-propyl group, n-butyl group, i-butyl group, sec-butyl group, tert-butyl group, n-pentyl group, n-hexyl group, n-octyl group, 2-ethylhexyl group, nonyl group, decyl group and dodecyl group, an alkoxy group such as methoxy group, ethoxy group, propoxy group and butoxy group, a halogen atom, a nitro group and an acetyl group.

Specific examples of the diazodisulfone derivative compound include the following compounds:

bis(methylsulfonyl)diazomethane, bis(ethylsulfonyl) diazomethane, bis(propylsulfonyl)diazomethane, bis(1-methylpropylsulfonyl) diazomethane, bis (butylsulfonyl) diazomethane, bis(1-methylbutylsulfonyl)diazomethane, bis (heptylsulfonyl)diazomethane, bis(octylsulfonyl) diazomethane, bis(nonylsulfonyl)diazomethane, bis (decylsulfonyl)diazomethane, bis(dodecylsulfonyl) diazomethane, bis(trifluoromethylsulfonyl)diazomethane, bis(cyclohexyl-sulfonyl)diazomethane, bis(benzylsulfonyl) diazomethane, bis(2-chlorobenzylsulfonyl)diazomethane, bis(4-chlorobenzylsulfonyl)diazomethane, bis (phenylsulfonyl)diazomethane, bis (4-methoxyphenylsulfonyl) diazomethane, bis(2-methylphenylsulfonyl)diazomethane, bis(3-methylphenylsulfonyl)diazomethane, bis(4-methylphenylsulfonyl)diazomethane, bis(2,4-dimethylphenylsulfonyl)diazomethane, bis(2,5-dimethylphenylsulfonyl)diazomethane, bis(3,4-dimethylphenylsulfonyl)diazomethane, bis(2,4,6-trimethylphenylsulfonyl)diazomethane, bis(4-fluorophenylsulfonyl)diazomethane, bis(2,4-difluorophenylsulfonyl)diazomethane, bis(2,4,6-trifluorophenylsulfonyl)diazomethane and bis(4-nitrophenylsulfonyl)diazomethane.

(5) Diazoketosulfone derivative compound represented by the following formula (PAG8):

(PAG8)

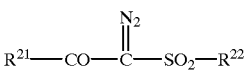

wherein $R^{21}$ and $R^{22}$ each independently represents an alkyl group which may have a substituent, a cycloalkyl group or an aryl group which may have a substituent. Specific examples of the substituent are the same as those of (PAG7).

Specific examples of the diazoketosulfone derivative compounds include the following compounds:

methylsulfonyl-benzoyl-diazomethane, ethylsulfonyl-benzoyl-diazomethane, methylsulfonyl-4-bromobenzoyl-diazomethane, ethylsulfonyl-4-bromobenzoyl-diazomethane, phenylsulfonyl-benzoyl-diazomethane, phenylsulfonyl-2-methylphenyl-diazomethane, phenylsulfonyl-3-methylphenyl-diazomethane, phenylsulfonyl-4-methylphenyl-diazomethane, phenylsulfonyl-3-methoxyphenyl-diazomethane, phenylsulfonyl-4-methoxyphenyl-diazomethane, phenylsulfonyl-3-chlorobenzoyl-diazomethane, phenylsulfonyl-4-chlorophenyl-diazomethane, tolylsulfonyl-3-chlorobenzoyl-diazomethane, tolylsulfonyl-4-chlorophenyl-diazomethane, phenylsulfonyl-4-fluorophenyl-diazomethane and tolylsulfonyl-4-fluorophenyl-diazomethane.

Among these compounds, those which decompose upon irradiation with actinic rays or radiation to generate an organic sulfonic acid are suitably used. By using such a compound, good resolution and good reproducibility of the resist performance can be obtained. The organic sulfonic acid as used herein is a sulfonic acid having an organic group. Examples of the organic group include an alkyl group which may have a substituent, a phenyl group which may have a substituent, and a naphthyl group which may have a substituent. Examples of the substituent include a linear or branched alkyl group having from 1 to 12 carbon atoms, an alkoxy group having from 1 to 6 carbon atoms, and a halogen atom such as fluorine, chlorine, bromine and iodine. Specific examples of the organic group include an alkyl group such as methyl group, ethyl group, n-propyl group, i-propyl group, n-butyl group, i-butyl group, tert-butyl group, n-amyl group, i-amyl group, tert-amyl group, sec-amyl group, n-hexyl group, n-pentyl group, n-octyl group, 2-ethylhexyl group, nonyl group, decyl group and dodecyl group; a substituted alkyl group such as chloromethyl group, dichloromethyl group, trichloromethyl group, chloroethyl group, fluoromethyl group, difluoromethyl group, trifluoromethyl group, perfluorobutyl group and perfluorooctyl group; a substituted phenyl group such as phenyl group, tosyl group, dimethylphenyl group, trimethylphenyl group, methoxyphenyl group, ethoxyphenyl group, chlorophenyl group, bromophenyl group, iodophenyl group, fluorophenyl group and pentafluorophenyl group; and a substituted naphthyl group such as naphthyl group, methylnaphthyl group, methoxynaphthyl group, chlorophenyl group, bromonaphthyl group and iodonaphthyl group. Among these organic groups, those having a fluorine atom are preferred.

Examples of such a compound include the following compounds (B1) to (B6), and these compounds (B1) to (B6) correspond, out of the compounds represented by formulae (PAG1) to (PAG8), those which generate an organic sulfonic acid.

(B1) Sulfonium salt compound having an organic sulfonate anion as a counter anion (B2) Iodonium salt compound having an organic sulfonate anion as a counter anion (B3) Organic disulfone derivative compound
(B4) Iminosulfonate derivative compound
(B5) Diazodisulfone derivative compound
(B6) Diazoketosulfone derivative compound As the photoacid generator, the compounds (B-3) to (B-6) which generate an organic sulfonic acid upon irradiation with actinic rays or radiation are preferred because the resolution of resist pattern is good, and the compounds (B-3) to (B-6) which generate a fluorinated organic sulfonic acid are more preferred because of their high sensitivity.

The amount of the photoacid generator (B) added is usually from 0.001 to 40 wt %, preferably from 0.01 to 20 wt %, more preferably from 0.1 to 5 wt %, based on the total weight of the positive photoresist composition (excluding the coating solvent) of the present invention. If the amount added of the compound capable of decomposing upon irradiation with actinic rays or radiation and thereby generating an acid is less than 0.001 wt %, the sensitivity decreases, whereas if the amount added exceeds 40 wt %, the light absorption by the resist excessively increases and the profile changes for the worse or the process (particularly bake) margin is disadvantageously reduced.

The positive photoresist composition of the present invention preferably contains (D) an organic basic compound. Examples of the organic basic compound include compounds having the following structures:

(A)

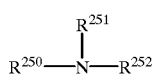

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, provided that $R^{251}$ and $R^{252}$ may combine with each other to form a ring;

(B)

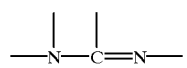

(C)

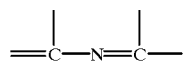

(D)

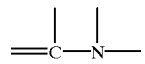

(E)

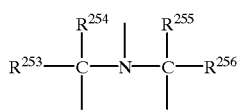

wherein $R^{253}$, $R^{254}$, $R^{255}$ and $R^{256}$, which may be the same or different, each represents an alkyl group having from 1 to 6 carbon atoms.

The compound is more preferably a nitrogen-containing basic compound having two or more nitrogen atoms different in the chemical environment within one molecule, still more preferably a compound having both a substituted or unsubstituted amino group and a ring structure containing a nitrogen atom, or a compound having an alkylamino group.

Specific preferred examples thereof include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine and substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Specific preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, tertiary morpholine derivatives such as N-aminomorpholine, N-(2-aminoethyl)morpholine, 1,5-diazabicyclo[4,3,0]non-5-ene, 1,8-diazabicyclo[5,4,0]undec-7-ene, 2,4,5-triphenylimidazole, N-methylmorpholine, N-ethylmorpholine, N-hydroxyethylmorpholine, N-benzylmorpholine and cyclohexylmorpholinoethylthiourea (CHMETU), and hindered amines described in JP-A-11-52575 (for example, those described in [0005]), however, the present invention is not limited thereto.

More preferred specific examples include 1,5-diazabicyclo[4.3.0]non-5-ene, 1,8-diazabicyclo[5.4.0]-7-undecene (DBU), 1,4-diazabicyclo[2.2.2]octane, 4-dimethylaminopyridne, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl)sebacate.

Among these, still more preferred are 1,5-diazabicyclo[4,3,0]non-5-ene, 1,8-diazabicyclo[5,4,0]undec-7-ene, 1,4-diazabicyclo[2,2,2]octane, 4-dimethylaminopyridine, hexamethylenetetramine, CHMETU and bis(1,2,2,6,6-pentamethyl-4-piperidyl)sebacate.

These organic basic compounds may be used either individually or in combination of two or more thereof. The amount of the organic basic compound used is usually from 0.001 to 10 wt %, preferably from 0.01 to 5 wt %, based on all solid contents of the resist composition. If the amount used is less than 0.001 wt %, the effect by the addition of the organic basic compound cannot be obtained, whereas if it exceeds 10 wt %, reduction in the sensitivity or deterioration of the developability in the non-exposed area is liable to result.

The positive photoresist composition of the present invention preferably contains (E) a surfactant, that is, preferably contains at least one surfactant of a fluorine-containing surfactant, a silicon-containing surfactant, a surfactant containing both a fluorine atom and a silicon atom, and a nonionic surfactant. Among these, a fluorine-containing surfactant, a silicon-containing surfactant and a surfactant containing both a fluorine atom and a silicon atom are more preferred.

Examples of these surfactants include surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. The following commercially available surfactants each may also be used as it is.

Examples of the commercially available surfactants which can be used include fluorine-containing surfactants and silicon-containing surfactants, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, polysiloxane polymer KP-341 (produced by Shin-Etsu Chemical Co., Ltd.) may also be used as a silicon-containing surfactant.

Specific examples of the nonionic surfactant which is another example of the surfactant, include polyoxyethylene alkyl ethers such as polyoxyethylene lauryl ether, polyoxyethylene stearyl ether, polyoxyethylene cetyl ether and polyoxyethylene oleyl ether; polyoxyethylene alkylaryl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of the surfactant (E) blended is usually from 0.001 to 2 wt %, preferably from 0.01 to 1 wt %, based on the solid contents in the composition of the present invention.

These surfactants may be used either individually or in combination of two or more thereof.

The positive photosensitive composition of the present invention usually contains a solvent which dissolves the components (A) and (B). The positive photosensitive composition is coated using at least one solvent selected from propylene glycol monoalkyl ether acetates such as propylene glycol monomethyl ether acetate (PGMEA) and propylene glycol monoethyl ether acetate; alkyl lactate esters such as methyl lactate and ethyl lactate; propylene glycol monoalkyl ethers such as propylene glycol monomethyl ether (PGME) and propylene glycol monoethyl ether; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; 2-heptanone; γ-butyrolactone; alkyl alkoxypropionates such as methyl methoxypropionate and ethyl ethoxypropionate; alkyl pyruvate esters such as methyl pyruvate and ethyl pyruvate; N-methylpyrrolidone; N,N-dimethylacetamide; and dimethylsulfoxide.

In the positive photoresist composition of the present invention, the solid concentration is usually from 0.5 to 20 wt %, preferably from 3 to 15 wt %, more preferably from 5 to 12 wt %.

The positive photoresist composition of the present invention may additionally contain, if desired, an acid-decomposable dissolution-inhibiting compound, a dye, a plasticizer, a surfactant other than the above, a photosensitizer, a compound which accelerates the solubility in the developer, and the like.

The positive photoresist composition of the present invention is coated on a substrate and forms a thin film. The coated film preferably has a thickness of 0.4 to 1.5 μm.

The composition is coated on a substrate (for example, a substrate coated with silicon/silicon dioxide) for use in the production of precision integrated circuit devices by an appropriate coating method such as spinner and coater, exposed through a predetermined mask, baked and then developed, whereby a good resist pattern can be obtained. The exposure light used here is preferably a far ultraviolet ray at a wavelength of 250 nm or less, more preferably 220 nm or less. More specifically, a KrF excimer laser (248 nm), an ArF excimer laser (193 nm), an $F_2$ excimer laser (157 nm), an X ray, an electron beam and the like may be used. Among these, an ArF excimer laser (193 nm) is preferred.

The developer which can be used for developing the positive photoresist composition for far ultraviolet exposure of the present invention is an alkaline aqueous solution of an inorganic alkali such as sodium hydroxide, potassium hydroxide, sodium carbonate, sodium silicate, sodium metasilicate and aqueous ammonia; a primary amine such as ethylamine and n-propylamine; a secondary amine such as diethylamine and di-n-butylamine; a tertiary amine such as triethylamine and methyldiethylamine; an alcoholamine such as dimethylethanolamine and triethanolamine; a quaternary ammonium salt such as tetramethylammonium hydroxide and tetraethylammonium hydroxide; or a cyclic amine such as pyrrole and piperidine.

This alkaline aqueous solution may further contain an alcohol and a surfactant each in an appropriate amount.

In the case of using the resist formed of the positive photoresist composition of the present invention as the upper layer resist of a two-layer resist, this upper layer resist exhibits sufficiently high resistance against oxygen plasma in the oxygen plasma etching of the organic polymer film constituting the lower layer, where the upper layer resist pattern undertakes the part of a protective mask. The oxygen plasma resistance of the positive photoresist composition of the present invention varies depending on the silicon content of the upper layer resist, the etching apparatus or the etching conditions, however, the etching selectivity ratio (etching rate ratio between the lower layer resist and the upper layer resist) can be from 10 to 100 and this is large enough.

In the formation of a pattern using the positive photoresist composition of the present invention, an organic polymer film is first formed on a substrate to be processed. This organic polymer film may be a known photoresist and examples thereof include various series such as FH series and FHi series produced by Fuji Film Olin, OiR series produced by Olin, and PFI series produced by Sumitomo Chemical Co., Ltd. The organic polymer film is formed by dissolving such a known material in an appropriate solvent and coating the obtained solution by a spin coating method, spraying method or the like. On the first layer of this organic polymer film, a film of the positive photoresist composition of the present invention is formed. In the same manner as the first layer, the resist material is dissolved in an appropriate solvent and the obtained solution is coated by a spin coating method, spraying method or the like.

The thus-formed two-layer resist is then subjected to a step of forming a pattern. In the first stage thereof, a pattern is formed on the photoresist composition film of the second layer, namely, the upper layer. More specifically, a mask is positioned, if desired, and then a high energy ray is irradiated through the mask, as a result, the photoresist composition in the irradiated area becomes soluble in an alkali aqueous solution and after the development with an alkali aqueous solution, a pattern is formed.

In the second stage, the organic polymer film is etched. This operation is performed by oxygen plasma etching using the pattern of the resist composition film as the mask to form a fine pattern having a high aspect ratio. This oxygen plasma etching of the organic polymer film is completely the same technique as the plasma ashing used at the time of peeling off the resist film after the completion of etching of a substrate in a conventional photoetching operation. This operation may be performed using a cylindrical plasma etching apparatus or a parallel plate-type plasma etching apparatus by flowing, for example, oxygen as the reactive gas, namely, etching gas.

Thereafter, the substrate is processed using the resulting resist pattern as a mask. For this processing, a dry etching method such as sputter-etching, gas plasma etching and ion beam etching, may be used.

The etching treatment by the two-layer film resist method using the resist film of the present invention is completed by an operation of peeling off the resist film. The resist layer can be peeled off simply by dissolving the organic polymer material of the first layer. At this time, since this organic polymer layer is a freely selected photoresist and is not modified (for example, cured) at all by the above-described photoetching operation, an organic solvent of the known photoresist itself may be used. Also, the resist film may be peeled off by plasma etching or the like without using a solvent.

EXAMPLES

The present invention is described in greater detail below by referring to the Examples, however, the present invention should not be construed as being limited thereto.

Synthesis Example (1)

Synthesis of Resin (1) to Resin (6)

11.4 g of allyltrimethylsilane, 9.8 g of maleic anhydride, 9.7 g of tert-butyl methacrylate and 5.0 g of α-acryloyloxy-β,β-dimethyl-γ-butyrolactone were added to 36 ml of dry THF and completely dissolved under a nitrogen stream. Thereafter, Initiator V-59 produced by Wako Purechemical Industries, Ltd. was added in an amount of 0.33 mol % based on the total molar number of the monomer and heated at 65° C. in a nitrogen stream.

After reacting the mixture for 20 hours, the reaction mixture was added dropwise to 450 ml of hexane and the precipitated white powder was filtered and then dried at room temperature for 1 hour under reduced pressure. Thereafter, the white powder was dissolved in 36 ml of dry THF and again added dropwise to 450 ml of hexane, and the precipitated white powder was filtered and then dried at 40° C. for 16 hours under reduced pressure to obtain Resin (1).

As a result of GPC measurement, the obtained Resin (1) was found to have a weight average molecular weight of 14,200 using polystyrene as a standard sample and the content of the components having a molecular weight of 1,000 or less was 4% in terms of GPC area ratio.

Resins (2) to (6) were obtained in the same manner as above.

The molar ratio of respective repeating units and the weight average molecular weight of Resin (1) to Resin (6) are shown in Table 1 together with the structural formula.

Synthesis Example (2)

Synthesis of Resin (7)

11.4 g of allyltrimethylsilane, 9.8 g of maleic anhydride, 9.7 g of tert-butyl methacrylate and 4.31 g of ethoxyethyl methacrylate were added to 36 ml of dry THF and completely dissolved under a nitrogen stream. Thereafter, thoroughly in the same manner as in Synthesis Example (1), Resin (7) was obtained.

As a result of GPC measurement, the obtained Resin (7) was found to have a weight average molecular weight of 13,500 using polystyrene as a standard sample and the content of the components having a molecular weight of 1,000 or less was 3% in terms of GPC area ratio.

The molar ratio of respective repeating units and the weight average molecular weight of Resin (7) are shown in Table 1 together with the structural formula.

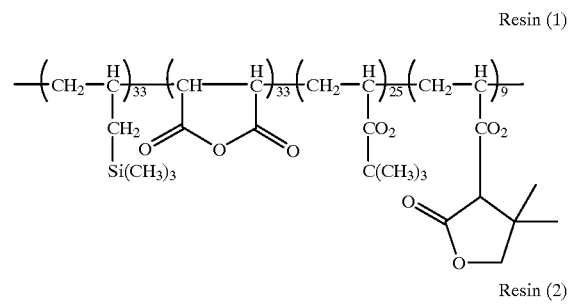

Resin (1)

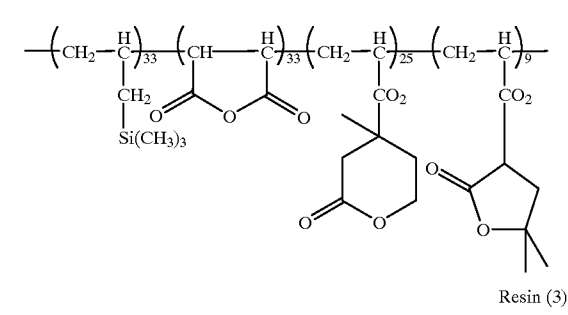

Resin (2)

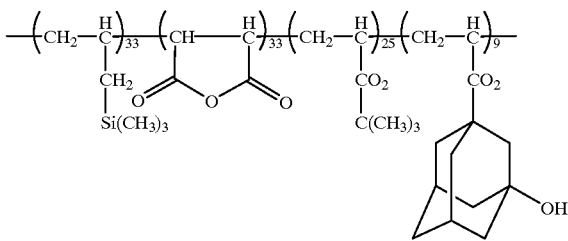

Resin (3)

-continued

Resin (4)

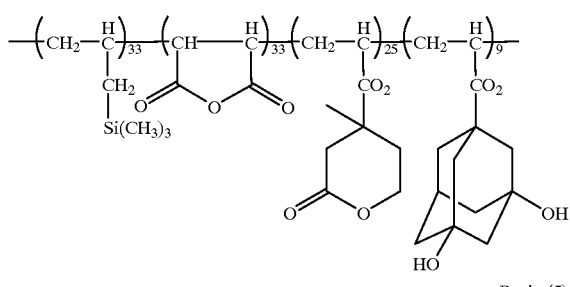

Resin (5)

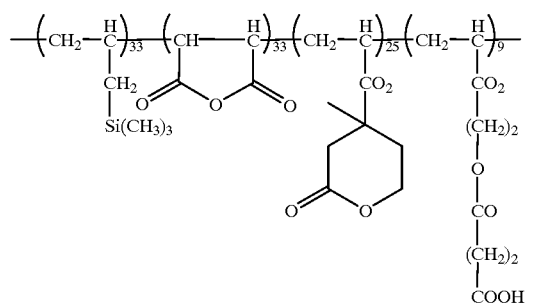

Resin (6)

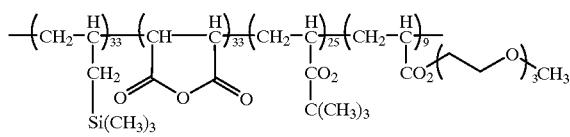

Resin (7) (for comparison)

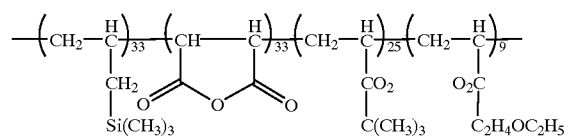

Example 1

The followings were dissolved in 19.2 g of propylene glycol monomethyl ether acetate and precisely filtered through a 0.1-μm membrane filter.

| | |
|---|---|
| Resin (1) as Acid-Decomposable Resin (A) component | 2 g |
| (2,4,6-Trimethylphenyl)diphenylsulfonium-heptadecafluorooctane sulfonate as a compound component of generating an acid upon exposure | 0.12 g |
| DBU | 0.012 g |
| Surfactant W-1 shown below | 0.003 g |

FHi-028D resist (a resist for i line, produced by Fuji Film Olin) was coated on a silicon wafer using a coater CDS-650 manufactured by Canon and baked at 90° C. for 90 seconds to form a uniform film having a thickness of 0.83 μm. This film was further heated at 200° C. for 3 minutes and then the film thickness was reduced to 0.71 μm. On this film, the silicon-containing resist prepared above was coated and baked at 90° C. for 90 seconds to have a layer thickness of 0.20 μm.

The thus-obtained wafer was exposed by an ArF stepper in which a resolution mask was loaded, while varying the exposure amount and the focus. Thereafter, the wafer was heated at 120° C. for 90 seconds in a clean room, developed with tetramethylammonium hydroxide developer (2.38%) for 60 seconds, rinsed with distilled water and dried to obtain a pattern. This pattern was observed by a scanning-type electron microscope, as a result, a line/space of 0.14 μm was resolved (resolution). The roughness was rated A.

The roughness was evaluated with an eye by observing the size of roughness (irregularities) at the line edge part in a line-and-space pattern of 0.15 μm through SEM, according to a 3-stage rating of A, B and C in the order from higher rating. Almost no roughness (irregularities) on the line edge was rated A, slight roughness (irregularities) on the line edge was rated B and outstanding roughness (irregularities) on the line edge was rated C.

For the purpose of evaluating the number of development defects, the resist solution prepared in Example (1) was coated on a 6-inch bare Si substrate to a thickness of 0.5 μm, baked at 140° C. for 60 seconds on a vacuum suction-type hot plate, exposed through a test mask of a 0.35 μm contact hole pattern (hole density ratio: 1.3) using Nikon stepper NSR-1505EX, subjected to after-exposure heating at 120° C. for 90 seconds and then to a battle development with a 2.38% tetramethylammonium hydroxide developer (2.38%) for 60 seconds, washed with pure water for 30 seconds, and spin-dried. The thus-obtained sample was measured on the number of development defects using a machine KLA-2112 manufactured by KLA Tencol K.K. and the obtained primary data value was used as the number of development defects. The number of development defects was 50.

Examples 2 to 6

Positive photoresist compositions each was prepared thoroughly in the same manner as in Example 1 except for using a resist composition having a formulation shown in Table 1 in place of the resist composition of Example 1, and then exposed and developed in the same manner as in Example 1. Also, the resolution, the line edge roughness and the number of development defects were evaluated. The capabilities obtained are shown in Table 2.

Comparative Example 1

A positive photoresist composition was prepared thoroughly in the same manner as in Example 1 except for using a resist composition having a formulation shown in Comparative Example 1 of Table 1 in place of the resist composition of Example 1, and then exposed and developed in the same manner as in Example 1. Also, the resolution, the line edge roughness and the number of development defects were evaluated. The capabilities obtained are shown in Table 2.

The surfactants used are:
W-1: Megafac F176 (produced by Dainippon Ink & Chemicals, Inc.) (fluorine-containing surfactant)
W-2: Megafac R08 (produced by Dainippon Ink & Chemicals, Inc.) (fluorine and silicone-containing surfactant)
W-3: polysiloxane polymer KP-341 (produced by Shin-Etsu Chemical Co., Ltd.)
The organic basic compounds used are:
DBU: 1,8-diazabicyclo[5.4.0]-7-undecene
TPI: 2,4,5-triphenylimidazole
DBN: 1,5-diazabicyclo[4.3.0]-5-nonene
DMAP: 4-dimethylaminopyridine

TABLE 1

| | (A) Resin Component | | (B) Photoacid Generator | (C) Solvent | (D) Organic Basic Compound | (E) Surfactant |
| --- | --- | --- | --- | --- | --- | --- |
| | Structure | Molecular Weight | | | | |
| Example | | | | | | |
| 1 | Resin (1) | 14200 | 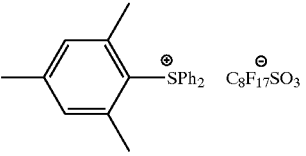 | PGMEA | DBU | W-1 |
| 2 | Resin (2) | 14700 | 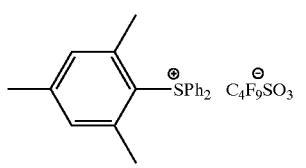 | PGMEA | DBU | W-1 |
| 3 | Resin (3) | 13200 | 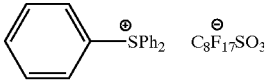 | PGMEA | DBN | W-2 |
| 4 | Resin (4) | 14600 | 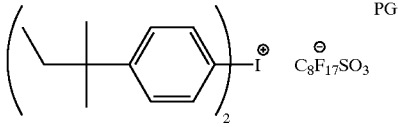 | PGMEA | DBN | W-2 |
| 5 | Resin (5) | 15000 | 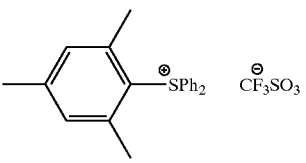 | PGME | TPI | W-3 |
| 6 | Resin (6) | 12800 | 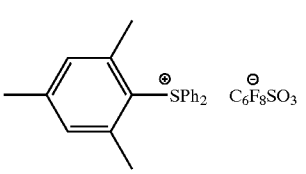 | PGME | DMAP | W-3 |
| Comparative Example 1 | Resin (7) | 13500 | 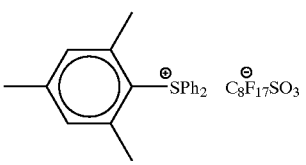 | PGMEA | DBU | W-1 |

TABLE 2

| | Resolution ($\mu$m) | Number of Development Defects | Roughness |
| --- | --- | --- | --- |
| Example 1 | 0.14 | 50 | A |
| Example 2 | 0.14 | 46 | A |
| Example 3 | 0.14 | 72 | A |
| Example 4 | 0.15 | 56 | A |
| Example 5 | 0.15 | 63 | B |
| Example 6 | 0.15 | 64 | B |
| Compound Example 1 | 0.18 | 158 | C |

As seen from the results above, the positive photoresist composition of the present invention exhibited excellent capabilities with respect to the resolution, the number of development defects and the roughness.

According to the present invention, a positive photoresist composition for use in the production of a semiconductor device can be provided, which ensures high resolution, reduced edge roughness of a line pattern and a small number of development defects.

While the invention has been described in detail and with reference to specific embodiments thereof, it will be apparent to one skilled in the art that various changes and modifications can be made therein without departing from the spirit and scope thereof.

This application is based on Japanese patent application No. 2000-105299 filed on Apr. 6, 2000, the entire contents of which incorporated herein by reference.

What is claimed is:

1. A positive photoresist composition comprising (A) a resin which comprises
    (a) a repeating unit represented by formula (I) shown below,
    (b) at least one repeating unit represented by formula (IIa) or (IIb) shown below,
    (c) a repeating unit represented by formula (III) shown below, and
    (d) a repeating unit represented by formula (IV) and which satisfies the following conditions (i)–(iii):
        (i) Is copolymerizable with monomers corresponding to the repeating units represented by formulae (I) to (III);
        (ii) Contains at least one functional group selected from the group consisting of a group containing a lactone structure, a group containing a lactam structure, —OH, —OCH$_3$, —OCORa, —NHCORa, —NHSO$_2$Ra, —N(R)CORa, —N(R)SO$_2$Ra, —COOH, —COORa, —CONHRa, —CONHSO$_2$Ra, —CON(R)SO$_2$Ra, —CON(Ra)(Rb) and —CN, wherein R, Ra and Rb each independently represents an alkyl or aryl group having from 1 to 10 carbon atoms, which may be substituted; and
        (iii) Is substantially incapable of decomposing by an acid,
    and which increases in the solubility in an alkali developer under the action of an acid:

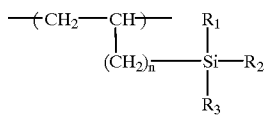   (I)

wherein $R^1$ to $R^3$ each independently represents an alkyl group, a haloalkyl group, a halogen atom, an alkoxy group, a trialkylsilyl group or a trialkylsilyloxy group, and n represents 0 or 1;

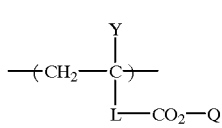   (IIa)

wherein Y represents a group selected from the group consisting of a hydrogen atom, a methyl group, a cyano group and a chlorine atom, L represents a single bond or a divalent linking group, and Q represents a hydrogen atom or a group capable of decomposing by an acid to generate a carboxylic acid;

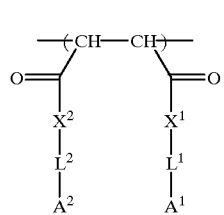   (IIb)

wherein $X^1$ and $X^2$ each independently represents a group selected from an oxygen atom, a sulfur atom, —NH— and —NHSO$_2$—; $L^1$ and $L^2$ each independently represents a single bond or a divalent linking group; $A^1$ represents —Q' or —COOQ', provided that when $X^1$ represents an oxygen atom and $L^1$ represents a single bond, $A^1$ represents —Q'; $A^2$ represents a hydrogen atom, a cyano group, a hydroxyl group, —COOH, —COOR', —CO—NH—R'', an alkyl group which may be substituted, a cyclic hydrocarbon group which may be substituted, an alkoxy group or —COOQ', wherein R' and R'' each independently represents an alkyl group which may have a substituent; and Q' represents a group capable of decomposing by an acid to generate a carboxylic acid;

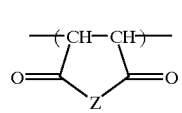   (III)

wherein Z represents an oxygen atom or N-$R^4$, $R^4$ represents a hydrogen atom, a hydroxyl group, an alkyl group having a linear or branched chain, or —O—SO$_2$—$R^5$, and $R^5$ represents an alkyl group or a trihalomethyl group;

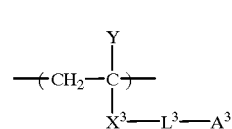   (IV)

wherein Y represents a group selected from the group consisting of a hydrogen atom, a methyl group, a cyano group and a chlorine atom, $X^3$ represents a group selected from the group consisting of —CO$_2$—, —O— and —CON(R)—, wherein R has the same meaning as above, $L^3$ represents a single bond or a divalent linking group, and $A^3$ represents a group represented by the following formula (V) or (VI)

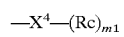   (V)

wherein $X^4$ represents an alicyclic hydrocarbon group which may contain a carbonyl bond or an ester bond within the ring, each Rc independently represents a hydrogen atom, an alkyl group, an alkyl group containing as a substituent at least one functional group selected from the group consisting of —OH, —OCH$_3$, —OCORa, —NHCORa, —NHSO$_2$Ra, —N(R)CORa, —N(R)SO$_2$Ra, —COOH, —COORa, —CONHRa, —CONHSO₂Ra, —CON(R)SO₂Ra, —CON(Ra)(Rb) and —CN, or a group selected from the group consisting of —OH, —OCH₃, —OCORa, —NHCORa, —NHSO₂Ra, —N(R)CORa, —N(R)SO₂Ra, —COOH, —COORa, —CONHRa, —CONHSO₂Ra, —CON(R)SO₂Ra, —CON(Ra)(Rb) and —CN, wherein R, Ra and Rb each has the same meaning as above, and m1 represents an integer of 0 to 5;

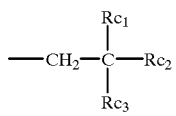
(VI)

wherein Rc1 and Rc3 each independently represents a hydrogen atom, an alkyl group having from 1 to 10 carbon atoms, which may be substituted, an alkyl group containing as a substituent at least one functional group selected from the group consisting of —OH, —OCH₃, —OCORa, —NHCORa, —NHSO₂Ra, —N(R)CORa, —N(R)SO₂Ra, —COOH, —COORa, —CONHRa, —CONHSO₂Ra, —CON(R)SO₂Ra, —CON(Ra)(Rb) and —CN, or a group selected from the group consisting of —COOH, —COORa, —CONHRa, —CONHSO₂Ra, —CON(R)SO₂Ra, —CON(Ra)(Rb) and —CN, provided that Rc1 and Rc3 are not simultaneously hydrogen; and Rc2 represents a group selected from the group consisting of —OH, —OCH₃, —OCORa, —NHCORa, —NHSO₂Ra, —N(R)CORa, —N(R)SO₂Ra, —COOH, —COORa, —CONHRa, —CONHSO₂Ra, —CON(R)SO₂Ra, —CON(Ra)(Rb) and —CN, wherein R, Ra and Rb each has the same meaning as above.

2. The positive photoresist composition as claimed in claim 1, wherein A³ in formula (IV) is a group represented by the following formula (VII):

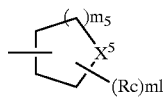
(VII)

wherein X⁵ represents a group selected from —CO—O— and —C(=O)—, Rc and m1 each has the same meaning as above, and m₅ represents an integer of 0 to 2.

3. The positive photoresist composition as claimed in claim 2, wherein the group represented by formula (VII) is a group represented by the following formula (VIII) or (IX):

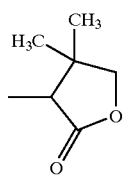
(VIII)

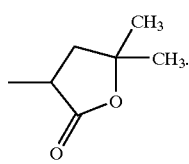
(IX)

4. The positive photoresist composition as claimed in claim 1, wherein X⁴ in formula (V) is an adamantane residue.

5. The positive photoresist composition as claimed in claim 1, which comprises:

(B) a compound capable of generating an acid upon irradiation with actinic rays or radiation, (C) an organic solvent capable of dissolving (A) and (B), and (D) an organic basic compound, in addition to the resin (A).

6. The positive photoresist composition as claimed in claim 5, wherein said component (B) is a compound capable of generating an organic sulfonic acid upon irradiation with actinic rays or radiation.

7. The positive photoresist composition as claimed in claim 5 which further comprises (F) at least one of a fluorine-containing surfactant, a silicon-containing surfactant and a nonionic surfactant.

* * * * *